US008125253B2

(12) United States Patent
Goldman et al.

(10) Patent No.: US 8,125,253 B2
(45) Date of Patent: Feb. 28, 2012

(54) SYSTEM AND METHOD FOR DYNAMICALLY SWITCHING BETWEEN LOW AND HIGH FREQUENCY REFERENCE CLOCK TO PLL AND MINIMIZING PLL OUTPUT FREQUENCY CHANGES

(75) Inventors: Stanley Goldman, Dallas, TX (US); Srinath Ramaswamy, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/610,438

(22) Filed: Nov. 2, 2009

(65) Prior Publication Data

US 2011/0102030 A1  May 5, 2011

(51) Int. Cl.
*H03L 7/06* (2006.01)
(52) U.S. Cl. ......... 327/156; 327/147; 327/163; 331/1 R; 331/18
(58) Field of Classification Search .................. 327/147, 327/156, 163; 331/1 R, 18, 34, 1 A
See application file for complete search history.

(56) References Cited

U.S. PATENT DOCUMENTS

| 6,028,727 A  * | 2/2000 | Vishakhadatta et al. ......... 360/51 |
| 6,611,176 B1 * | 8/2003 | Goldman .......................... 331/17 |
| 7,570,043 B2 * | 8/2009 | Goldman ..................... 324/72.5 |
| 7,639,070 B2 * | 12/2009 | Goldman ..................... 327/552 |

* cited by examiner

*Primary Examiner* — Patrick O'Neill
(74) *Attorney, Agent, or Firm* — John R. Pessetto; W. James Brady; Frederick J. Telecky, Jr.

(57) ABSTRACT

A circuit is provided for use with a clock having an input divider portion, a feedback divider portion, a phase detector portion, a loop compensation filter portion and a voltage controlled oscillator portion. The input divider portion receives a reference signal and outputs a divided reference signal. The feedback divider portion receives an output signal from the circuit and outputs a divided feedback signal. The phase detector portion outputs a phase detector signal based on the divided reference signal and the divided feedback signal. The loop compensation filter portion outputs a tuning signal based on the phase detector signal. The voltage controlled oscillator portion output the outputs a signal based on the tuning signal. The phase detector portion changes the phase detector signal based on the input divider portion receiving the control signal and the feedback divider portion receiving the control signal.

5 Claims, 14 Drawing Sheets

SYSTEM AND METHOD FOR DYNAMICALLY SWITCHING BETWEEN LOW AND HIGH FREQUENCY REFERENCE CLOCK TO PLL AND MINIMIZING PLL OUTPUT FREQUENCY CHANGES

BACKGROUND

The phase-locked loop (PLL) circuit is widely used in radio, telecommunications, and other electronic applications. A PLL essentially works to synchronize the output phase and frequency of a controllable oscillator to match the output phase and frequency of a reference oscillator. In this way, a PLL can also be used to synthesize multiple frequencies from a single reference oscillator. Thus, PLLs are often used to generate stable frequencies for use as clocks in other circuits (e.g., analog to digital converters, microprocessors, etc). Since the accuracy and stability of clock signals are essential for proper circuit functionality, it is necessary to design PLLs so that their output signals remain as stable as possible.

FIG. 1 illustrates a simple schematic of a conventional charge-pump PLL. PLL 100 includes a phase detector 102, a charge pump 104, a low pass filter 106, and a voltage-controlled oscillator (VCO) 108. Low pass filter 106 includes resistor 110 and filter capacitor 112.

In operation, phase detector 102 receives reference signal 114 from an external oscillator (not shown). Phase detector 102 compares the phase of reference signal 114 to that of VCO output signal 116. Depending on the phase difference, phase detector 102 then outputs a pulse of specific duration at UP output 118 and also at DOWN output 120. A pulse at UP output 118 causes charge pump 104 to add charge to filter capacitor 112, whereas a pulse at DOWN output 120 causes charge pump 104 to remove charge from filter capacitor 112. As charge is added or removed from filter capacitor 112, the voltage at the input of VCO 106 (Vtune input 122) is thereby increased or decreased. This causes VCO 106 to respond by increasing or decreasing the frequency of VCO output signal 116. The phase of VCO output signal 116 is then again compared to that of reference signal 114, and the cycle repeats again. In this manner, the phase and frequency of VCO output signal 116 is repeatedly adjusted to eventually match that of reference signal 114.

Once the phase and frequency of output signal 116 matches that of reference signal 114, PLL 100 is considered to be in the "locked" state, and mainly functions to maintain a constant voltage at Vtune input 122, such that VCO output signal 116 remains "locked" to that of reference signal 114. This is implemented by phase detector 102 outputting identical pulses on UP output 118 and DOWN output 120, such that no net charge is transferred to filter capacitor 112, thus allowing the voltage at Vtune input 122 to remain constant.

In FIG. 1, only the fundamental components of a typical PLL were shown, for simplicity in the explanation of basic PLL functionality. In practice, PLLs typically implement another important component known as a frequency divider. A frequency divider is a circuit that takes an input signal with frequency, $f_{in}$, and produces an output signal with frequency $f_{out}$, where $f_{out}=f_{in}/n$, and n is an integer. Most PLLs include a divider in the feedback loop, between the VCO output and the feedback input to the phase detector (often referred to as a "feedback divider"). In this manner, the PLL can serve as a frequency synthesizer and produce a range of frequencies from a single fixed reference input (typically a crystal oscillator). Some PLLs also include a divider between the external crystal oscillator and the reference input to the phase detector (often referred to as a "reference divider").

In many PLL system applications, it is necessary to change the crystal oscillator frequency during operation, while keeping the PLL output constant. An example of this is using the PLL output to provide a fixed sampling clock to an analog-to-digital converter (ADC) digitizing an audio signal, and dynamically changing the crystal oscillator frequency from a low frequency to a high frequency (and vice versa). This can occur in a multi-standard cell phone with a low frequency clock for low power operation, where dynamic switching between low and high frequency asynchronous clocks would constantly be occurring in order to minimize power consumption. Changing the crystal oscillator frequency also requires changing the divider ratios to keep the PLL output frequency constant. Therefore, in dynamic switching, it is necessary to hold the present VCO frequency, wait a period of time, change the crystal oscillator, change the divider data, and then relock the VCO frequency to the same frequency before the hold state. However, after a hold and wait period, large phase errors typically arise that cause a large temporary frequency glitch in the PLL output upon relock, which is undesirable. Therefore it is desired to implement "zero phase start" (ZPS) initialization of the PLL, in which the phase error upon relock is minimized, such that the PLL output remains as stable as possible. Conventional techniques on implementing ZPS in PLL initialization will be discussed below.

FIG. 2 illustrates a conventional charge pump PLL system 200, which implements ZPS upon PLL initialization. As illustrated in the figure, PLL system 200 includes a reference divider 204, a phase detector 206, a charge pump 208, a VCO 210, a feedback divider 212, a data storage and state machine portion 214 and a low-pass filter 228.

Low-pass filter 228 includes a storage capacitor 230, compensation capacitor 234 and a resistor 232. Low-pass filter 228, resistor 232 and storage capacitor 230 construct a RC circuit 236 that passes low frequency signals but attenuates undesired high frequency signals, wherein compensation capacitor 234 compensates for the phase shift caused by RC circuit 236. Low-pass filter 228 smoothes Vtune signal 222 by removing short-term high-frequency oscillations (typically noise) that are passed through charge pump 208.

Reference divider 204 is arranged to receive a reference signal 202 as input and output a divided reference signal 218. Phase detector 206 is arranged to receive divided reference signal 218 and divided feedback signal 220 as input and output a UP signal 224 and a DOWN signal 226. Charge pump 208 is arranged to receive UP signal 224 and DOWN signal 226 from phase detector 206 and to output signal 222 to VCO 210 and to low-pass filter 228. VCO 210 provides an output signal 216 to an application circuit (not shown) and to feedback divider 212. Feedback divider 212 receives output signal 216 and provides divided feedback signal 220 to phase detector 206.

In operation, reference divider 204 receives reference signal 202 from an external crystal oscillator (not shown). Reference divider 204 produces a divided reference signal 218, which has the frequency of reference signal 202 divided by an integer ratio M. Phase detector 206 receives divided reference signal 218 from reference divider 204 and divided feedback signal 220 from feedback divider 212. Phase detector 206 measures the phase difference between divided reference signal 218 and divided feedback signal 220 and outputs UP signal 224 and DOWN signal 226 accordingly. UP signal 224 and DOWN signal 226 each consist of a pulse, with a pulse width depending on the measured phase difference. If there is a leading phase difference (divided reference signal 218 leads divided feedback signal 220), then UP signal 224 consists of a pulse having pulse width larger than that of DOWN signal 226. If there is a lagging phase difference (divided reference signal 218 lags divided feedback signal 220), then DOWN signal 226 consists of a pulse that is longer duration than that of UP signal 224.

Charge pump 208 receives UP signal 224 and DOWN signal 226, and depending on their relative pulse durations, either pumps or removes charge from storage capacitor 230, which effectively increases or decreases the voltage at Vtune 222. VCO 210 responds to the change in Vtune 222 by either increasing or decreasing the frequency of output signal 216. Output signal 216 is input into feedback divider 212, which produces a divided feedback signal 220, which has the frequency of feedback signal 216 divided by an integer ratio N. Divided feedback signal 220 is then input back into phase detector 204, and the process repeats again. In this manner, PLL system 200 functions to enable VCO 210 to output a stable output signal 216 to an application circuit (not shown), such that the frequency and phase of divided reference signal 218 and divided feedback signal 220 are the same, or as close as possible.

Once the phase and frequency of divided feedback signal 220 matches that of divided reference signal 218, PLL system 200 is considered to be in the "locked" state, and mainly functions to maintain a constant voltage at Vtune input 222, such that divided feedback signal 220 remains "locked" to that of divided reference signal 218. This is implemented by phase detector 206 outputting UP signal 224 and DOWN signal 226 that consist of identical pulses, such that no net charge is transferred to storage capacitor 230, thus allowing the voltage at Vtune input 222 to remain constant.

Data storage and state machine portion 214 is what determines the state of PLL system 200 (hold, relock, etc). Data storage and state machine portion 214 includes a look-up table (LUT) having a current/desired state functions in addition to corresponding flip-flop data. More specifically, the LUT is preprogrammed such that desired state may be quickly determined for any detected state, i.e., a current state. Further, once the current state is detected, and therefore the desired state is determined, the corresponding data required to change the logic of flip-flops to affect the desired state is additionally quickly determined by the LUT.

Data storage and state machine portion 214 is operable to detect a current state of reference divider 204, i.e., the state of flip-flops (not shown) within reference divider 204, which provides divided reference signal 218 as a function of reference signal 202. Further, data storage and state machine portion 214 is operable to provide new data to reference divider 204 in order to change the state of the flip-flops within reference divider 204, which will therefore change divided reference signal 218 as a function of reference signal 202. Similarly, data storage and state machine portion 214 is operable to detect a current state of feedback divider 212, i.e., the state of flip-flops (not shown) within feedback divider 212, which provides divided feedback signal 220 as a function of output signal 216. Further, data storage and state machine portion 214 is operable to provide new data to feedback divider 212 in order to change the state of the flip-flops within feedback divider 212, which will therefore change divided feedback signal 220 as a function of output signal 216. In this manner, the divide ratio M for reference divider 204 and the divide ratio N for feedback divider 212 are determined by data storage and state machine portion 214.

As previously mentioned, PLL 200 implements ZPS in order to minimize phase error upon initialization. The theory behind ZPS is explained further with regards to FIG. 3.

FIG. 3 shows timing diagrams illustrating examples of each of the three possible scenarios detected by phase detectors when measuring phase differences: positive phase difference, zero phase difference, and negative phase difference. To illustrate an example of each case, FIG. 3 includes a top waveform 302, a middle waveform 304, and a bottom waveform 306. These graphs are generic and can be discussed in terms of any charge-pump PLL, but for ease of explanation, we explain FIG. 3 in terms of PLL 200 of FIG. 2.

In top waveform 302, x-axis 308 represents time, whereas y-axis 310 represents current into storage capacitor 230. In this case, the rising edge of divided feedback signal 220 (indicated by time point 312) is ahead of the rising edge of divided reference signal 218 (indicated by time point 314), thus indicating a positive phase difference. This causes the pulse on DOWN signal 226 to be of longer duration than the pulse on UP signal 224. Thus, as shown in the figure, the current going out of storage capacitor 230 (current 316, denoted by $i_D$) is on for longer time than that of the current going into storage capacitor 230 (current 318, denoted by $i_U$). As a result, the charge removed from storage capacitor 230 (charge 320, denoted by $Q_D$) is larger than the charge pumped into capacitor 230 (charge 322, denoted by $Q_U$), and the net charge into capacitor 230 ($Q_U$–$Q_D$) is negative. This causes the voltage at Vtune 222 to decrease, which in turn reduces the frequency of output signal 216, such that divided feedback signal 220 slows clown to become more in phase with divided reference signal 218.

In middle waveform 304, x-axis 324 represents time, whereas y-axis 308 represents current into storage capacitor 230. In this case, the rising edge of divided feedback signal 220 (indicated by time point 314) coincides with the rising edge of divided reference signal 218, thus indicating zero phase difference. This causes the pulse on DOWN signal 226 to be of same duration as the pulse on UP signal 224. Thus, as shown in the figure, there is current going out of storage capacitor 230 (current 328, denoted by $i_D$) and current going in to storage capacitor 230 (current 326, denoted by $i_U$) for the same amount of time. This causes the net charge pumped into storage capacitor 230 (charge 330, denoted by $Q_D$) to be identical to the charge removed from storage capacitor 230 (charge 332, denoted by $Q_D$). Hence there is no change to the voltage on Vtune 222, and output signal 216 remains constant.

In bottom waveform 306, x-axis 334 represents time, whereas y-axis 308 represents current into storage capacitor 230. In this case, the rising edge of divided feedback signal 220 (indicated by time point 336) lags behind the rising edge of divided reference signal 218 (indicated by time point 314), thus indicating a negative phase difference. This causes the pulse on UP signal 224 to be of longer duration than the pulse on DOWN signal 226. Thus, as shown in the figure, the current going out of storage capacitor 230 (current 340, denoted by $i_D$) is on for shorter time than that of the current going into storage capacitor 230 (current 338, denoted by $i_U$). As a result, the charge pumped into storage capacitor 230 (charge 342, denoted by $Q_U$) is larger than the charge removed from storage capacitor 230 (charge 344, denoted by $Q_D$), and the net charge into capacitor 230 ($Q_U$–$Q_D$) is positive. This causes the voltage at Vtune 222 to increase, which in turn increases the frequency of output signal 216, such that divided feedback signal 220 speeds up to become more in phase with divided reference signal 218.

When PLL 200 is in lock, the rising edge from divided feedback signal 220 lines up with the rising edge of reference signal 218, and no net charge goes into storage capacitor 230, as shown in middle waveform 304. In this manner, the voltage on Vtune 222 remains constant and output signal 216 remains constant. As mentioned previously, in many PLL system applications, during the lock condition it is often desired to hold the present output frequency, wait a period of time, and then relock the output frequency to the same frequency before the wait period. Thus, upon relocking PLL 200 after a hold period, it is desired to initialize with the rising edges of divided feedback signal 220 and divided reference signal 218 already lined up (zero phase difference), such that no net charge is transferred onto storage capacitor 230 and output signal 216 remains unperturbed. This is the motivation behind the implementation of ZPS in PLL systems.

The hold and relock sequences are implemented in PLL system 200 as follows. While PLL system 200 is in the locked state, if the hold command is issued from logic within data storage and machine portion 214, the addresses of reference divider 204 and feedback divider 212 are stored in the LUT of data storage and machine portion 214. The reference divider ratio M and the feedback divider ratio N are also stored in data storage machine portion 214. During the hold period, the frequency of the crystal oscillator (not shown) can be changed. If the crystal oscillator frequency is changed, however, a new reference divider ratio M and a new feedback divider ratio N must be calculated such that output frequency 216 remains constant. Also, the new addresses to be put into flip-flops (not shown) in each of reference divider 204 and feedback divider 212 must be calculated such that upon relock, the positive edge of divided reference signal 218 lines up with the positive edge of divided feedback signal 220 going into phase detector 206. This provides for a ZPS upon relocking PLL system 200, so that phase error and glitches in output signal 216 are minimized.

This conventional implementation of ZPS is not ideal however, since it requires complicated calculations of the new addresses to be put into reference divider 204 and feedback divider 212. These calculations takes up a significant amount of time, not to mention extra power and space due to the additional logic and circuitry required.

Another problem of PLL system 200 is the leakage of charge during the hold state. When the hold command is executed, charge pump 208 needs to keep the voltage at Vtune 222 constant so that the frequency and phase of output signal 216 remain unchanged during the hold period. However, the output of charge pump 208 is usually a drain terminal of a CMOS transistor, which has high leakage current. As a consequence, during the hold state there is significant charge leakage off storage capacitor 230, which alters the voltage on Vtune 222 and thus causes changes in the frequency and phase of output signal 216.

A second type of conventional PLL system implementing ZPS will now be described with reference to FIG. 4.

FIG. 4 illustrates another conventional PLL system 400, which uses a charge pump with a coarse tune digital-to-analog converter (DAC). As illustrated in the figure, PLL system 400 includes a reference divider 404, a phase detector 406, a charge pump 408, a low pass filter 410, a VCO 412, a time-to-digital converter 414, an up/down integrating counter 416, a DAC 418, a data storage and state machine portion 420 and a feedback divider 422.

Reference divider 404 is arranged to receive a reference signal 402 as input and to output a divided reference signal 424. Phase detector 406 is arranged to receive divided reference signal 424 and a divided feedback signal 442 as input and to output a phase error signal 426 to charge pump 408 and time-to-digital converter 414. Charge pump 408 is arranged to receive phase error signal 426 as input and to output a fine tuning signal 428 to VCO 412. Time-to-digital converter 414 is arranged to receive phase error signal 426 as input and to output a signal 430 to up/down integrating counter 416. Up/down integrating counter 416 is operable to output a signal 432 to DAC 418. DAC 418 is arranged to receive signal 432 and output a coarse tuning signal 434. VCO 412 is arranged to receive fine tuning signal 428 and coarse tuning signal 434 as inputs and to output an output signal 436 to an application circuit (not shown) and to feedback divider 422. Feedback divider 422 is arranged to receive output signal 436 as input and provide divided feedback signal 442 to phase detector 406. Data and state machine portion 420 updates data for each of reference divider 404, feedback divider 422, and DAC 418 via data buses 444, 440, and 448, respectively.

Similar to low pass filter 228 discussed above with reference to FIG. 2, low-pass filter 410 removes unwanted high-frequency signals (typically noise) from fine tune signal 428 before fine tune signal 428 is provided to VCO 412.

PLL system 400 operates in a very similar manner as PLL system 200 of FIG. 2. PLL system 400 functions to enable VCO 412 to output a stable output signal 436 to an application circuit (not shown), such that the frequency and phase of divided reference signal 424 and divided feedback signal 442 are the same, or as close as possible.

PLL system 400 differs from PLL system 200 of FIG. 2 in that there are two branches for controlling VCO 412, a coarse tuning branch, which includes time-to-digital converter 414, UP/DOWN integrating counter 416, and DAC 418, and a fine tuning branch, which includes charge pump 408 and low pass filter 410. In operation, VCO 412 is first adjusted by coarse tune signal 434 until the frequency of output signal 336 is close to the desired value, e.g., such that the phase error signal 426 is within a predetermined value. VCO 412 is then adjusted via fine tuning signal 428 to get make output signal 436 more accurate.

Similar to data storage and state machine portion 214 discussed above with reference to FIG. 2, data storage and state machine portion 420 includes a LUT having a current/desired state functions in addition to corresponding flip-flop data. Data storage and state machine portion 420 is operable to detect the current states of reference divider 404 and feedback divider 422, and to also provide new data to change the state of flip-flops (not shown) within reference divider 404 and feedback divider 422.

Data storage and state machine portion 420 differs from data storage and state machine portion 214 of FIG. 2, in that data storage and state machine portion 420 additionally provides data to DAC 418, via data bus 438, in order to change coarse tuning signal 434 as a function of signal 432.

As mentioned previously, in many PLL system applications, during the lock condition it is often desired to hold the present output frequency, wait a period of time, and then relock the output frequency to the same frequency before the wait period. In PLL system 400, this is implemented in a similar fashion as in PLL system 200 of FIG. 2. While PLL system 400 is in the locked state, if the hold command is issued from logic within data storage and machine portion 420, the addresses of reference divider 404 and feedback divider 422 are stored in the LUT of data storage and machine portion 420. The reference divider ratio M and the feedback divider ratio N are also stored in data storage machine portion 420. During the hold period, the frequency of the crystal oscillator (not shown) can be changed. If the crystal oscillator frequency is changed, however, a new reference divider ratio M and a new feedback divider ratio N must be calculated such that output frequency 436 remains constant. Also, the new addresses to be put into flip-flops (not shown) in each of reference divider 404 and feedback divider 422 must be calculated such that upon relock, the positive edge of divided reference signal 424 lines up with the positive edge of divided feedback signal 442 going into phase detector 406. This provides for a ZPS upon relocking PLL system 300, so that phase error and glitches in output signal 436 are minimized.

Since it employs coarse and fine tuning capabilities, the conventional PLL system 400 of FIG. 4 has improved performance and accuracy in maintaining a stable output. However, the ZPS still has the issue of needing to calculate the values of the new data to be loaded into flip-flops of the reference divider 404 and feedback divider 422 upon relocking. As discussed previously, these calculations not only require time but additional power, circuitry, and space. Moreover, during the hold state, the charge leakage from storage capacitor 446 is still a problem, which affects the stability of output signal 336.

These issues pose a problem because in many PLL applications, system designers would like to switch between a low and high frequency crystal oscillator clock, while keeping the PLL output frequency constant. This dynamic switching of the reference frequency requires the PLL to enter the hold state while the reference clock is changed. During this time, charge leakage will cause the output frequency to drift. Also, upon relock, ZPS must be implemented to reduce phase error. However, the conventional implementation of ZPS takes up time and resources due to the calculations involved.

Due to these drawbacks, conventional PLL systems have poor performance when dynamically switching between high frequency and low frequency reference input clocks. Even if ZPS is implemented to reduce phase error upon relock, the extra logic & circuitry required consumes power, uses up space and increases the response time of the PLL. In addition, charge leakage during hold state causes changes in the frequency of the output signal, which is undesirable.

What is needed is a PLL system that can minimize changes in its output frequency during the hold state and also implement ZPS upon initialization (relock), in a manner that does not require a significant amount of additional calculations, power consumption, and silicon space.

BRIEF SUMMARY

It is an object of the present invention to provide a PLL system that can minimize changes in its output frequency by adding a hold state and also implement ZPS upon initialization (relock), in a manner that does not require a significant amount of additional calculations, power consumption, and silicon space.

In accordance with an aspect of the present invention a circuit is provided for use with a clock signal having a plurality of clock pulses, each clock pulse having a rising edge and a falling edge. The circuit is operable to receive a reference signal and to output an output signal. The circuit includes an input divider portion, a feedback divider portion, a phase detector portion, a loop compensation filter portion and a voltage controlled oscillator portion. The input divider portion is arranged to receive the reference signal and is operable to output a divided reference signal. The feedback divider portion is arranged to receive the output signal and is operable to output a divided feedback signal. The phase detector portion is operable to output a phase detector signal based on the divided reference signal and the divided feedback signal. The loop compensation filter portion is operable to output a tuning signal based on the phase detector signal. The voltage controlled oscillator portion is operable to output the output signal based on the tuning signal. The phase detector portion is further operable to change the phase detector signal based on the input divider portion receiving the control signal and the feedback divider portion receiving the control signal, and further based on the control signal and a rising edge of a clock pulse.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with one aspect of the present invention, a PLL circuit includes an active loop filter with strategically placed switches and switch timing circuitry that eliminates a major leakage path from storage capacitors during the hold state. Further, the PLL circuit includes digital synchronizing circuitry, and count-down-to-zero reference and feedback dividers that, upon relock of the PLL, synchronize the rising edges of the reference input and the feedback input going into the phase detector, such that no phase error is incurred upon restart. In this manner, ZPS is implemented without the need for time-consuming calculations or additional computational circuitry.

A block diagram for an example circuit in accordance with an aspect of present invention will now be described with reference to FIG. 5.

Figure 5:
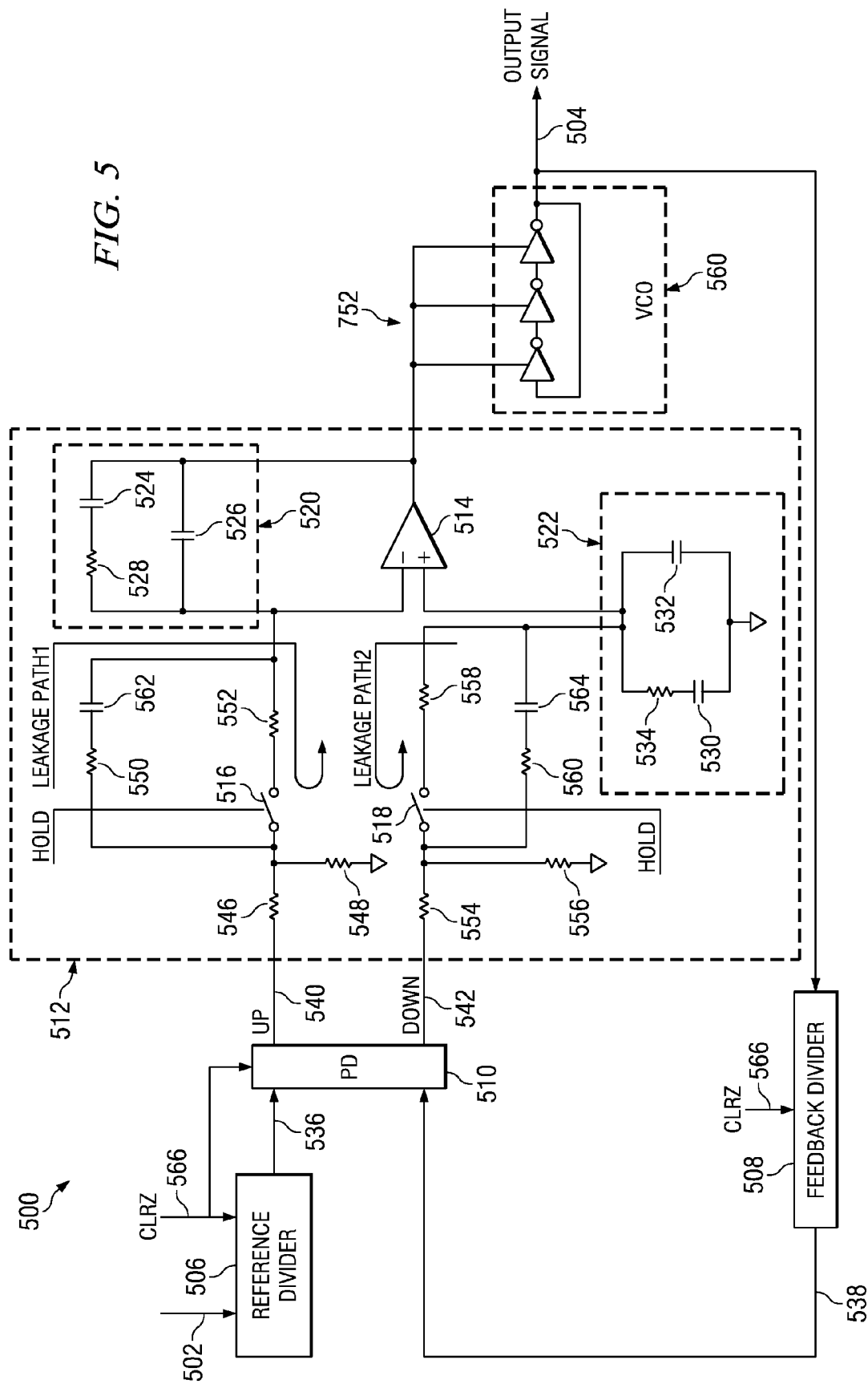
FIG. 5 illustrates an example PLL system 500 in accordance with an aspect of the present invention, wherein circuitry holds the frequency and relocks PLL system 500 after the hold period.

FIG. 5 illustrates an example PLL system 500 in accordance with an aspect of the present invention, wherein circuitry holds the frequency and relocks PLL system 500 after the hold period. As illustrated in FIG. 5, PLL system 500 includes a programmable reference divider 506, a programmable feedback divider 508, a phase detector 510, a loop filter 512 and a VCO 560.

Loop filter 512 includes two single-pole single-throw switches 516 and 518, operational amplifier 514, differential low-pass filters 520 and 522, resistors 546, 548, 550, 552, 554, 556, 558, and 560, and capacitors 562 and 564. Low-pass filter 520 includes storage capacitor 524, compensation capacitor 526 and resistor 528. Low-pass filter 522 includes storage capacitor 530, compensation capacitor 532 and resistor 534.

Low-pass filters 520 and 522 are arranged as a differential RC network of operational amplifier 514 such that loop filter 512 has a two-zero two-pole polynomial transfer function. This two-zero two-pole polynomial transfer function stabilizes PLL system 500 and filters out any unwanted high frequencies (e.g., noise) from passing through to output signal 504.

Reference divider 506 is arranged to receive a reference signal 502 as input and output a divided reference signal 536. Phase detector 510 is arranged to receive divided reference signal 536 and output an UP signal 540 and a DOWN signal 542. When switch 516 is closed, as will be discussed in more detail below, UP signal 540 is transmitted to low-pass filter 520 and the negative terminal of operational amplifier 514. When switch 518 is closed, as will be discussed in more detail below, DOWN signal 542 is transmitted to low-pass filter 522 and the positive terminal of operational amplifier 514. Operational amplifier 514 provides a Vtune signal 572 to VCO 560. VCO 560 provides an output signal 504 to an application circuit (not shown) and to feedback divider 508. Feedback divider 508 provides a divided feedback signal 538 to phase detector 510.

In operation, switches 516 and 518 are nominally closed. Reference divider 506 receives reference signal 502 from an external crystal oscillator (not shown). Reference divider 506 produces a divided reference signal 536, which has the frequency of reference signal 502 divided by an integer ratio M. Phase detector 510 measures the phase difference between divided reference signal 536 and divided feedback signal 538 and outputs UP signal 540 and DOWN signal 542 accordingly. UP signal 540 and DOWN signal 542 each consist of a pulse, with a pulse width depending on the measured phase difference.

Figure 1:
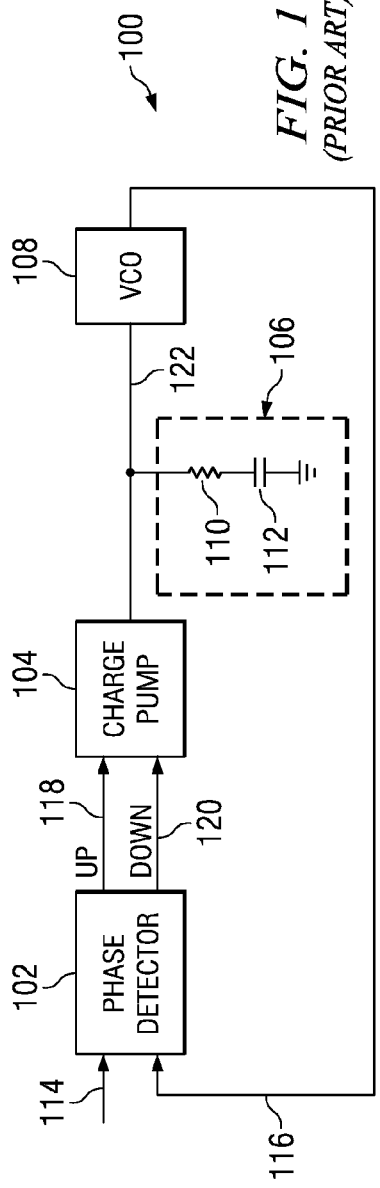
FIG. 1 illustrates a simple schematic of the fundamental circuit of a typical charge-pump PLL (Prior Art)
Figure 2:
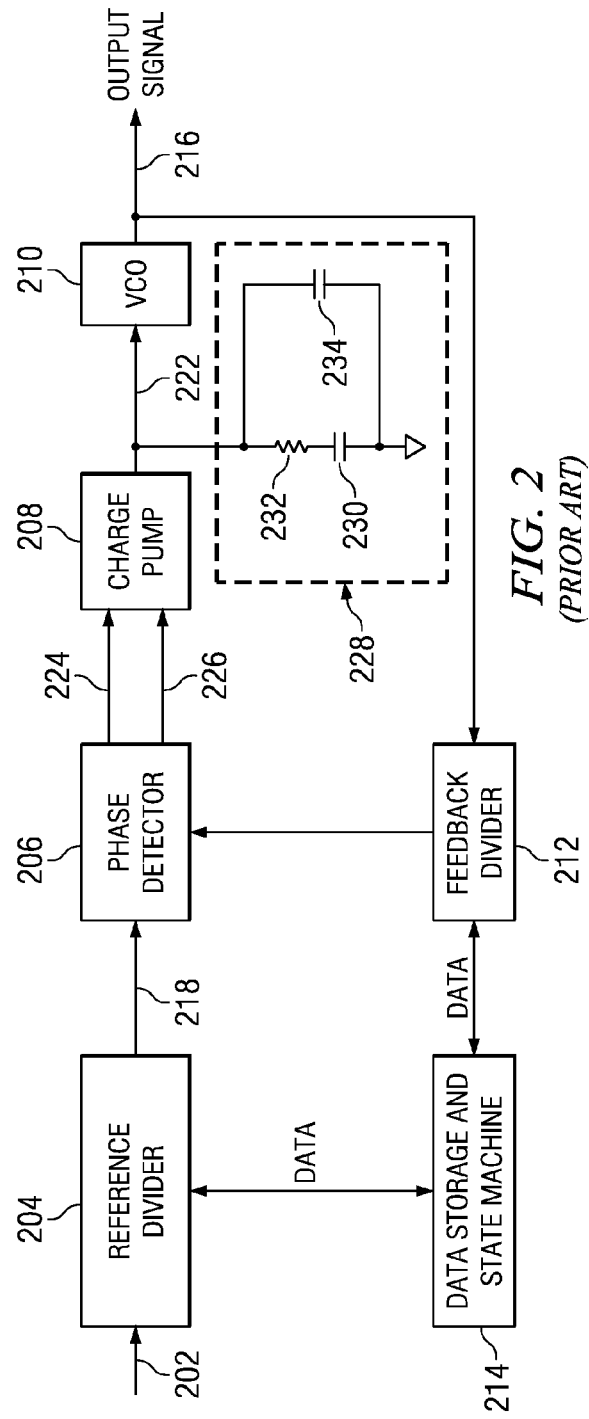
FIG. 2 illustrates a conventional charge pump PLL system, which implements ZPS upon PLL initialization (Prior Art)
Figure 3:
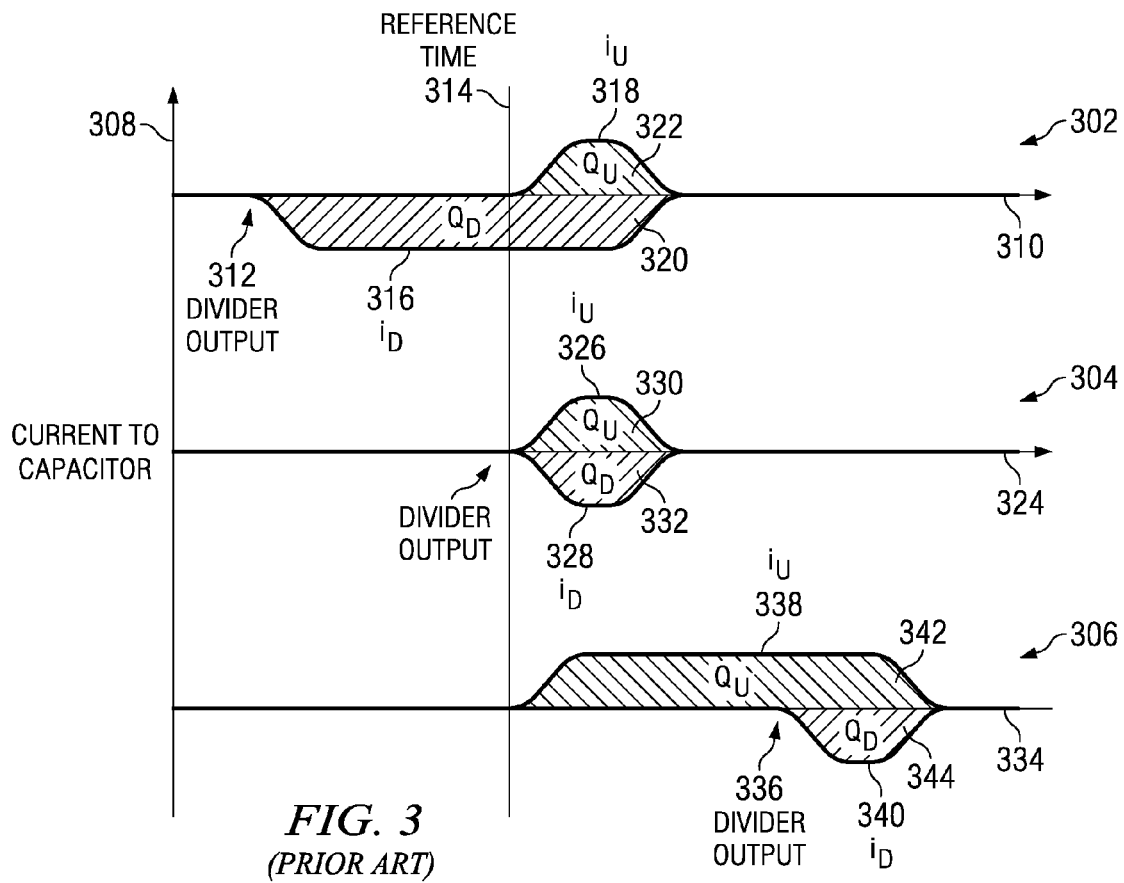
FIG. 3 shows timing diagrams illustrating examples of each of the three possible scenarios detected by phase detectors when measuring phase differences: positive phase difference, zero phase difference, and negative phase difference (Prior Art)

UP signal 540 and DOWN signal 542 are then processed by loop filter 512 to either increase or decrease the voltage of Vtune 572, as dictated by their relative pulse widths. Although loop filter 512 does not contain an explicit charge pump structure (as in, for example, charge pump 208 of PLL 200 of FIG. 2), during operation, it effectively performs the actions of a charge pump by pumping and removing charge from storage capacitor 524 and storage capacitor 530, in order to adjust the voltage of Vtune 572. VCO 560 responds to the change in Vtune 572 by either increasing or decreasing the frequency of output signal 504. Output signal 504 is input into feedback divider 508, which produces divided feedback signal 538, which has the frequency of output signal 504 divided by an integer ratio N. Divided feedback signal 538 is then input back into phase detector 510, and the process repeats again. In this manner, PLL system 500 functions to output a stable output signal 504 to the application circuit, such that the frequency and phase of divided reference signal 536 and divided feedback signal 538 are the same, or as close as possible.

Figure 4:
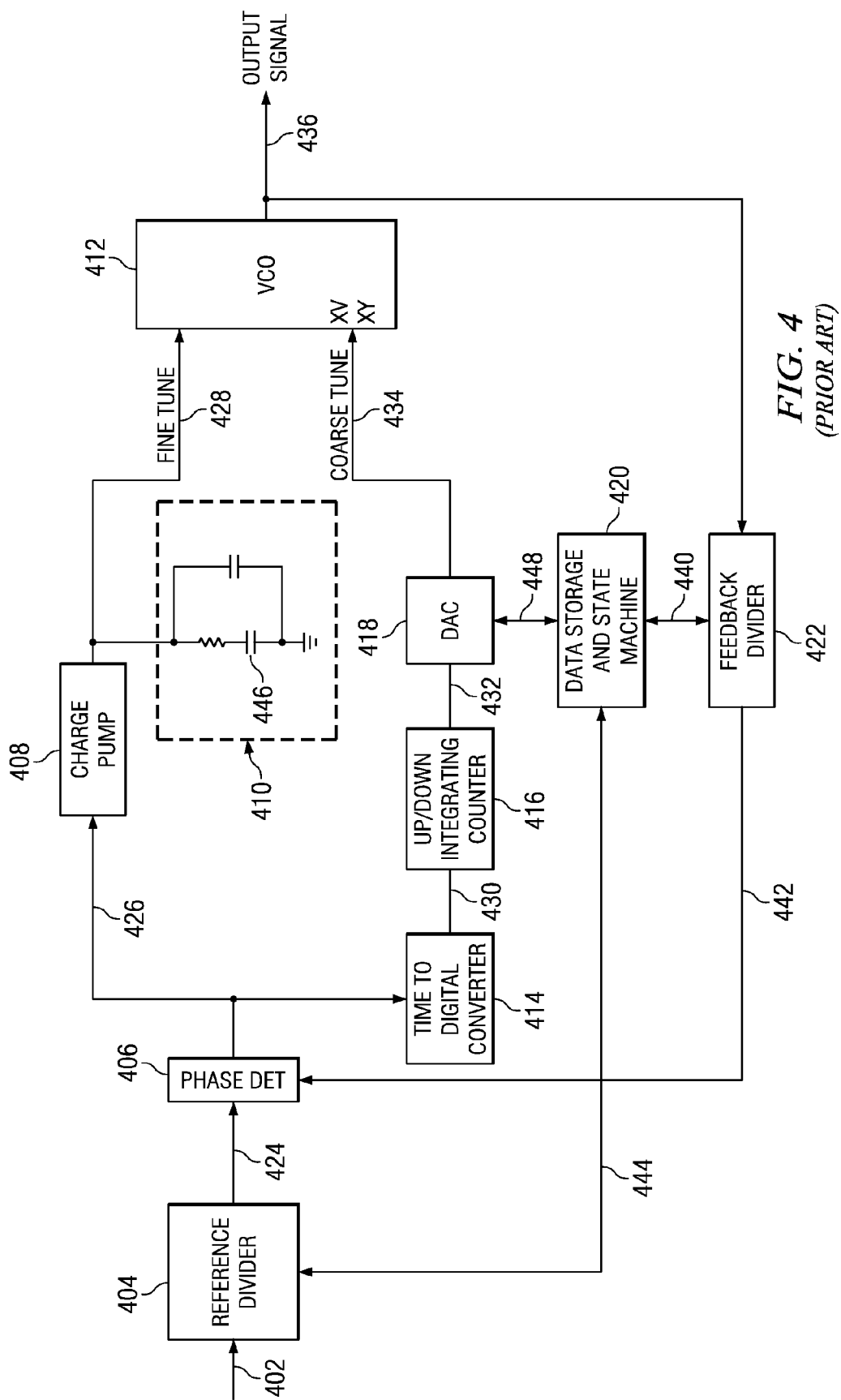
FIG. 4 illustrates another conventional PLL system 400, which uses a charge pump with a coarse tune digital-to-analog converter (DAC) (Prior Art)

Although the basic operation of PLL system 500 is similar to that of convention PLL systems (such as 200 of FIG. 2), PLL 500 differs in two key ways. The first key difference is the implementation of switches for use in the hold condition. As discussed previously, conventional PLL systems (such as PLL systems 200 and 400, of FIG. 2 and FIG. 4) have the problem of charge leakage off storage capacitors during the hold condition. In PLL 500, loop filter 512 contains switches 516 and 518, which are arranged to eliminate major charge leakage paths during the hold state.

When switch 516 is closed, there is a DC path to ground from storage capacitor 524 via resistor 528, resistor 552 and resistor 546 to the UP output of phase detector 510, which appears like a short to ground. Similarly, when switch 518 is closed, there is a DC path to ground from capacitor 530 via resistor 534, resistor 558 and resistor 554 to the DOWN output of phase detector 510, which appears like a short to ground. The presence of these DC paths to ground make for potential leakage paths for charge to leak off storage capacitors 524 and 530 during the hold state. Thus, upon entering the hold state, switch 516 and switch 518 are opened. When switch 516 is open, the aforementioned DC path to ground from storage capacitor 524 is eliminated. Similarly, when switch 518 is open, the aforementioned DC path to ground from storage capacitor 530 is eliminated. Thus, during the hold condition, the major charge leakage paths are removed, which helps the voltage of Vtune signal 572 to remain constant, which therefore allows output signal 504 to remain constant.

With switch 516 and switch 518 open, there are still other leakage paths present, namely to the inputs and to the output of operational amplifier 514. From storage capacitor 524, there is a path to negative terminal of operational amplifier 514, and also to the output of operational amplifier 514; from storage capacitor 530 there is a path to the positive terminal of operational amplifier 514 and also to the output of operational amplifier 514. However, leakage to the output of operational amplifier 514 is nullified by the feedback control of operational amplifier 514. Also, leakage to the inputs of operational amplifier 514 are determined by the gates of CMOS transistors (not shown), which usually have very small leakage compared to the drains of CMOS transistors.

The second key difference in PLL system 500 is its implementation of ZPS. Reference divider 506 and feedback divider 508 contain additional logic to make the positive edge of divided reference signal 536 and the positive edge of divided feedback signal 538 line up going into phase detector 510 upon relock. The details of the divider circuitry will be discussed below in reference to FIGS. 7-9.

With the implementation of switches, PLL system 500 minimizes the frequency change during the hold period by eliminating major charge leakage paths. Also, the novel implementation of ZPS minimizes the peak frequency change during reacquisition and minimizes the time it takes to relock. In an example embodiment, a PLL in accordance with an aspect of the present invention is operable to relock after approximately 16 reference clock periods.

Before examining the functionality and behavior of PLL system 500 during the hold and relock conditions, the behavior during initial lock acquisition will first be discussed. The process of PLL system 500 initially locking to a reference input is illustrated in FIG. 6.

Figure 6:
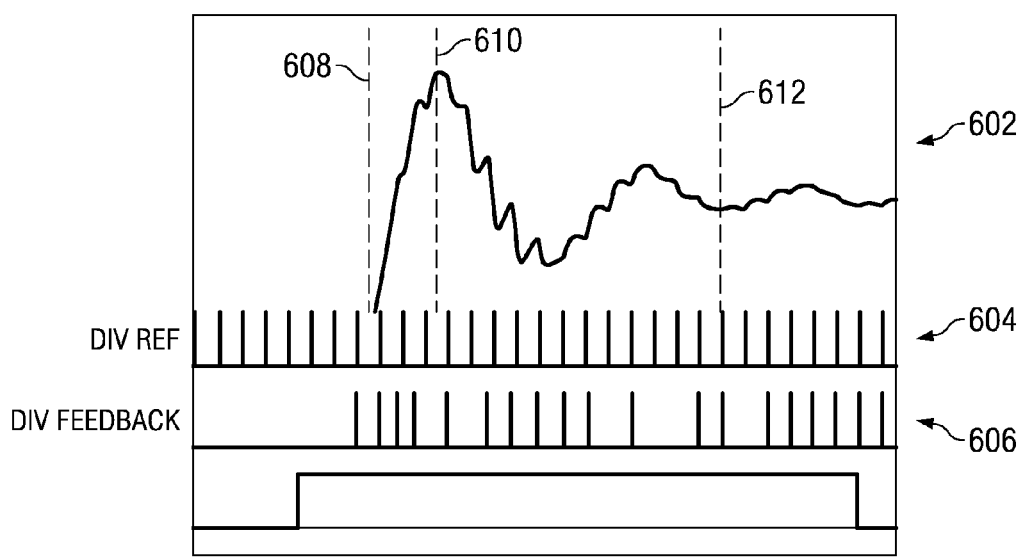
FIG. 6 shows simulated data of various signals while PLL system 500 is first acquiring lock.

Specifically, FIG. 6 shows simulated data of various signals while PLL system 500 is first acquiring lock. Shown in this figure are three waveforms as functions of time: waveform 602, waveform 604, and waveform 606. In the figure, waveform 602 represents the voltage across storage capacitor 524 (which is closely related to the voltage of Vtune 572, the input voltage of VCO 560). Waveform 604 represents the voltage of divided reference signal 536 and waveform 606 represents the voltage of divided feedback signal 538.

As shown in the figure, waveform 604, which represents divided reference signal 536, has evenly spaced periods throughout. Initially, waveform 606 starts out with very widely spaced period. At 200 μs, (dotted line 608), waveform 602 exhibits a very large increase in voltage. This is because the frequency of divided reference waveform 606 has been detected to be much slower than that of divided feedback waveform 604, and thus needs to be increased. Waveform 606 responds with increasing frequency, however, at some point (280 μs, clotted line 610), phase detector 510 detects that the frequency is now too fast and thus the voltage of waveform 602 begins to decrease significantly.

This process of increasing and decreasing the voltage of waveform 602 (voltage across storage capacitor 524) continues until about 600 us (dotted line 612), when waveform 606 eventually begins to track waveform 604. This indicates the phase and frequency of divided feedback signal 538 and the phase and frequency of divided reference signal 536 are aligned. Consequently, the voltage across storage capacitor 524 (represented by waveform 602) remains more or less constant since very little correction to waveform 606 is needed.

As demonstrated in FIG. 6, the initial locking process demands large changes in the voltage across storage capacitor 524 in order to correct the phase error between the output and the reference signal. However, upon relocking after a hold period, it is undesirable to have these large changes in voltage because the output frequency needs to remain constant. This illustrates the need for minimizing the charge leakage from storage capacitor 524 (and also storage capacitor 530), such that voltage on Vtune 572 can remain constant. As explained earlier, in PLL system 500 this is accomplished by the implementation of switches 516 and 518, which are opened upon entering the hold condition.

FIG. 6 also illustrates the need for implementing ZPS upon relock. If ZPS is not implemented (i.e., the rising edge of divided feedback signal 538 is not lined up with the rising edge of divided reference signal 536 going into phase detector 510), then upon relocking PLL system 500, there will be a large change in the voltage of Vtune 572, due to the large phase error measured. This will cause an undesirable glitch in output signal 504. Thus, as mentioned earlier, in PLL system 500, reference divider 506 and feedback divider 508 include logic to ensure that, upon relock, the rising edges of divided reference signal 536 and divided feedback signal 538 line up going into phase detector 510. Unlike other alternative circuits, this implementation of ZPS is accomplished with the use of existing D flip-flops and without adding storage flip-flops, which saves significant real estate on a chip and avoids complicated state machine logic. An example programmable divider will now be described with reference to FIG. 7.

Figure 7:
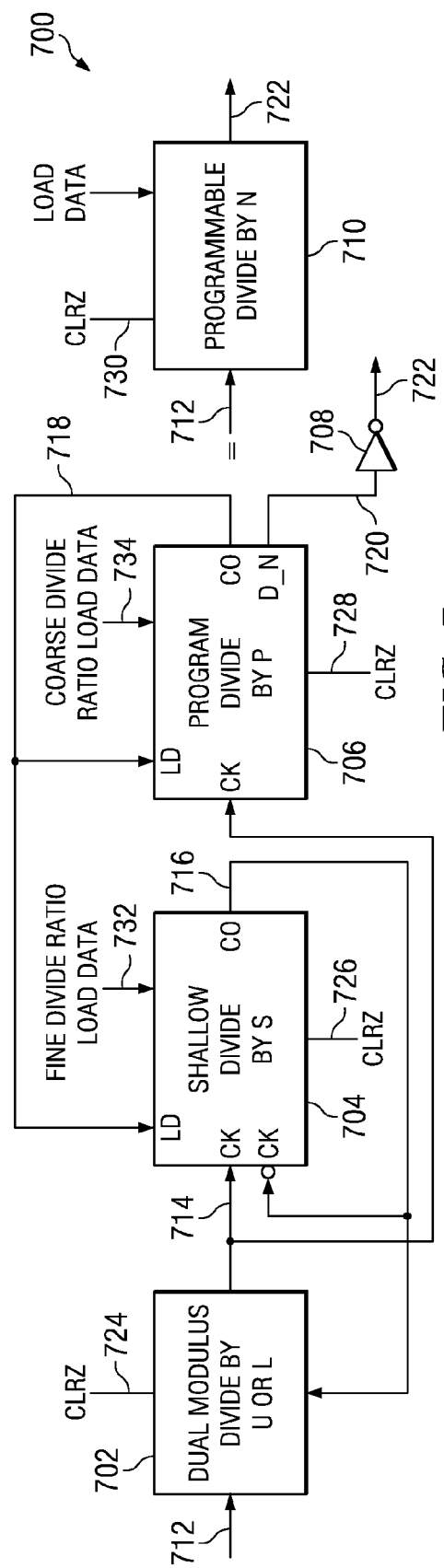
FIG. 7 illustrates an example pulse swallowing counter in accordance with the present invention.

FIG. 7 illustrates an example programmable divider that includes a pulse swallowing counter in accordance with the present invention. As illustrated in the figure, pulse swallowing counter 700 includes a dual modulus prescaler 702, a swallow counter 704, a program (main) counter 706 and an inverter 708. Pulse swallowing counter 700 is equivalent to a system divider block 710, which may be used for programmable feedback divider 508 and programmable reference divider 506 in PLL system 500 of FIG. 5.

Dual modulus prescaler 702 is arranged to receive an input signal 712 and output a scaled frequency signal 714 to swallow counter 704 and program counter 706. Swallow counter 704 is arranged to receive scaled frequency signal 714 from dual modulus prescaler 702, to receive fine divide ratio load data 732 and to output carryout signal 716 as a clock enable signal back to itself, and also as modulus control signal back to dual modulus prescaler 702. Program counter 706 is arranged to receive scaled frequency signal 714, to receive coarse divide ratio load data 734 and to output a carryout signal 718 and output a scaled frequency signal 720. Scaled frequency signal 720 is sent to inverter 708 and is also fed back to load data ports of swallow counter 704 and program counter 706. Inverter 708 is arranged to receive scaled frequency signal 720 and provide output signal 722.

Each of dual modulus prescaler 702, swallow counter 704, program counter 706 has an individual clearing (CLRZ) signal 724, 726, and 728, respectively. In an example embodiment, all CLRZ signals 724, 726, and 728 are the same signal, and can be represented as one single CLRZ signal 730 on divider block 710. In contrast to conventional dividers, divider block 710 differs in that, in response to CLRZ signal 730, output signal 722 changes asynchronously, regardless of the rising edge of input signal 712. This is a beneficial aspect for the implementation of ZPS in accordance with the present invention, because it allows the outputs of the reference divider and the feedback divider to be synchronized upon relock (regardless of their input clocks). An example implementation of asynchronous CLRZ in the divider logic will be discussed later with reference to FIG. 9.

In accordance with an aspect of the present invention, dual modulus prescaler 702 enables integer divisions while retaining the high speed characteristics of a fast prescaler. Selecting a divide by 4 or 5 dual modulus prescaler allows integer divide ratios of 12, 13, 14 . . . 64 and 8, 9, 10. The selection of divide by 4 in dual modulus prescaler 702 makes the highest operating frequency for pulse swallowing counter 700 to be 250 MHz. This enables operation of the loop up to 1 GHz with a reference frequency that can range from 16 MHz (1 GHz/64) to 83 MHz (1 GHz/12).

Dual modulus prescaler 702 has two fixed prescaler values with a switch to select the output of either one. The divide ratios in pulse swallowing counter 700 in FIG. 7 are defined as follows:

U=upper (larger) divide ratio of dual modulus prescaler 702 (L+1),

L=lower divider ratio of dual modulus prescaler 702,

S=divide ratio of swallow counter 704
= number of times dual modulus prescaler 702 divides by U in a complete divide cycle, P=divide ratio of program counter 706
= total number of cycles of dual modulus prescaler 702 in a complete divide cycle.

The divide cycle of pulse swallowing counter 700 begins with a load signal (carryout signal 718, which goes to LD inputs on swallow counter 704 and program counter 706) that synchronously loads fine divide ratio load data 732 into swallow counter 704 and coarse divide ratio load data 734 into program counter 706. Then carryout signal 716 and carryout signal 718 go low, which ends the load mode and allows for counting to begin. The low state of carryout signal 716 enables swallow counter 704 and sets dual modulus prescaler 702 to select its upper divide ratio, U. Swallow counter 704 and program counter 706 start to count until swallow counter 704 counts to its maximum value, i.e., S pulses of scaled frequency 714. At this point, S·U pulses of input signal 712 have occurred.

When swallow counter 704 reaches maximum value, carryout signal 716 goes high, which disables swallow counter 704 and changes dual modulus prescaler 702 to its lowest divide ratio, L. Program counter 706 continues to count up its maximum value, i.e., (P−S)·L more pulses of input signal 712, while swallow counter 704 holds its count, i.e., carryout signal 716 is still high. Once program counter 706 reaches maximum value, carryout signal 718 goes high and enables the load condition, and a new divide cycle begins. Equation (1) computes the total number of clocks counted N in the divide cycle:

$$N = S \cdot U + (P-S) \cdot L \quad (1)$$

Substituting L+1=U into equation (1) and rearrange produces equation (2) that computes the divide ratio N for a dual modulus prescaler:

$$N = S + L \cdot P \quad (2)$$

An example shows how to set the data bits to get the desired divide ratio. To divide by 13 with U=5 and L=4, P would be set to 3 (integer (N/L)=integer (13/4)=3) and S would be set to 1 (13−L·P).

A practical limitation on the pulse swallowing technique is that P can not be less than S. If P is less than S, program counter 706 will reach maximum count before swallow counter 704. Consequently, the prescaler value would never change and the circuit would operate like a fixed prescaler. The implementation of an example dual modulus prescaler in accordance with an aspect of the present invention is shown in FIG. 8.

Figure 8:
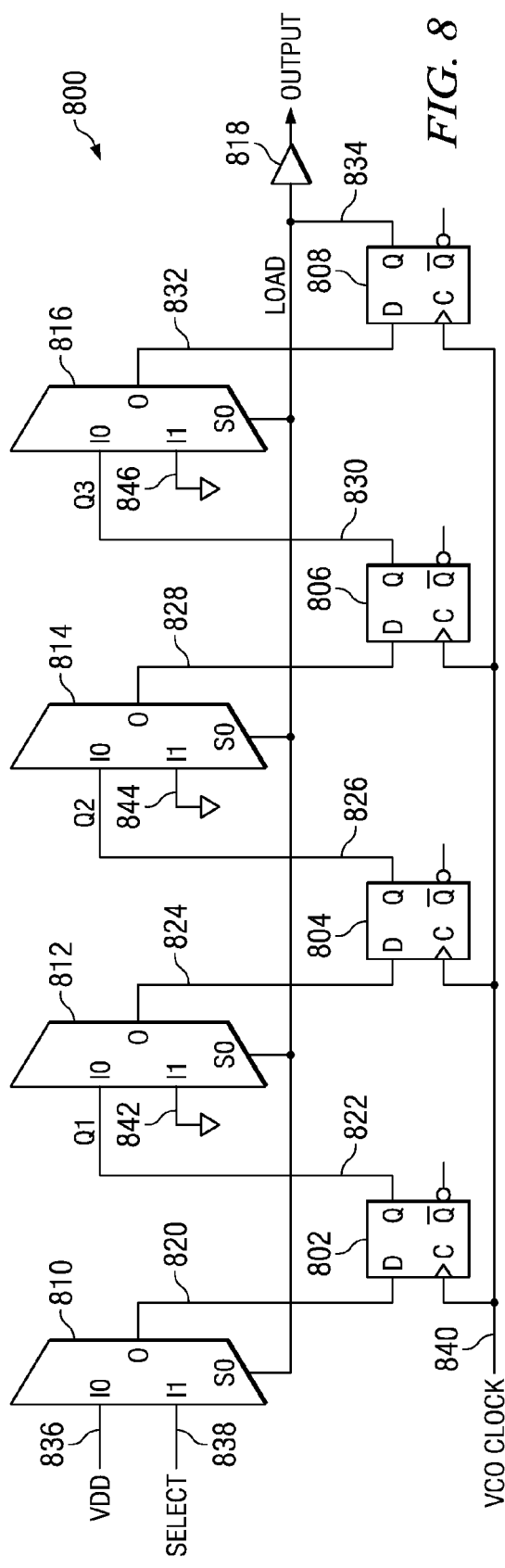
FIG. 8 illustrates a schematic for a dual modulus prescaler (divide by 4 or 5)

FIG. 8 illustrates a schematic for an example dual modulus prescaler in accordance with an aspect of the present invention (divide by 4 or 5). As shown in the figure, dual modulus prescaler 800 includes a 4 bit shift register having shift registers 802, 804, 806, and 808, multiplexers 810, 812, 814, and 816, and a buffer 818.

Shill register 802 is arranged to receive a VCO clock 840 and a signal 820 from multiplexer 810 as inputs and provide a signal 822 to multiplexer 812. Shift register 804 is arranged to receive VCO clock 840 and a signal 824 of multiplexer 812 as inputs and output a signal 826 to multiplexer 814. Similarly, shill register 806 is arranged to receive VCO clock 840 and a signal 828 of multiplexer 814 as inputs and output a signal 830 to multiplexer 816. Finally, shift register 808 is arranged to receive VCO clock 840 and a signal 832 of multiplexer 816 as inputs and output a LOAD signal 834 to buffer 818. Signal 834 is used as a select signal for multiplexers 810, 812, 814, and 816.

Multiplexer 810 is arranged to receive a logic-high VDD input 836 and a select signal 838 as inputs and output signal 820 to shift register 802. Multiplexer 812 is arranged to receive a logic-low input 842 and signal 822 of as inputs and output signal 824 to shift register 804. Multiplexer 814 is arranged to receive a logic-low input 844 and signal 826 as inputs and output signal 828 to shift register 806. Multiplexer 816 is arranged to receive a logic-low input 846 and signal 830 as inputs and output signal 832 to shift register 808.

In operation, dual modulus prescaler 800 shifts logic-high VDD input 836 from the first shift register, shift register 802, to the last shift register, shift register 808. A logic-high at LOAD output 834 of shift register 808 synchronously reloads the shift registers with a logic-high in shift register 802 and logic-lows in shift registers 804, 806, and 808. The load operation is done by switching to the parallel load data word for the duration of the load and then switching back to the shift register connection. Then, the shift operation begins again.

Figure 9:
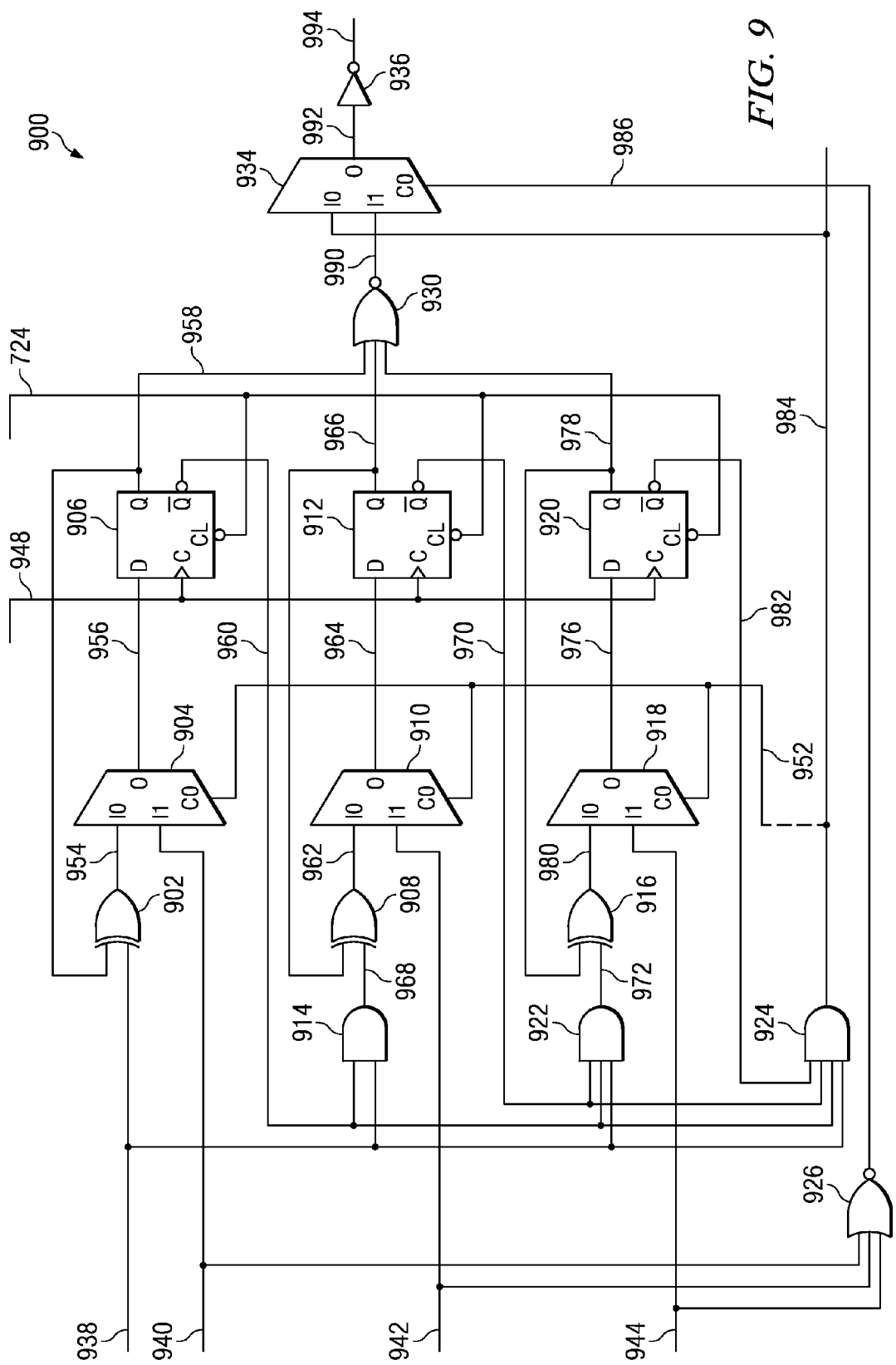
FIG. 9 shows a three bit example programmable counter that is used in present invention.

FIG. 9 shows an example three bit programmable count-down-to-zero counter that may be used as a divider in accordance with an aspect of the present invention.

As illustrated in the figure, counter 900 includes, an XOR gate 902, a multiplexer (MUX) 904, a flip flop 906, an XOR gate 908, a MUX 910, a flip flop 912, an AND gate 914, an XOR gate 916, a MUX 918, a flip flop 920, an AND gate 922, an AND gate 924, a NOR gate 926, a NOR gate 930, a MUX 934 and a NOT gate 936. Counter 900 receives, as inputs, an enable signal 938, a data 940, a data 942, a data 944, a clock signal 948, a CLRZ signal 724 and a load signal 952. Counter 900 outputs a signal 994.

XOR gate 902 is arranged to receive enable signal 938 and a signal 958 as inputs and to output a signal 954. MUX 904 is arranged to receive signal 954 from XOR gate 902, to receive data 940, to receive load signal 952 and to output a signal 956. Specifically, MUX 904 selects one of signal 954 and data 940 to output as signal 956 based on the logic state of a pulse of load signal 952. Flip flop 906 is arranged to receive signal 956, to receive clock signal 948, to receive CLRZ signal 724, to output a signal 958 and to output a signal 960.

XOR gate 908 is arranged to receive a signal 966 and a signal 968 as inputs and to output a signal 962. MUX 910 is arranged to receive signal 962 from XOR gate 908, to receive data 942, to receive load signal 952 and to output a signal 964. Specifically, MUX 910 selects one of signal 962 and data 942 to output as signal 964 based on the logic state of a pulse of load signal 952. Flip flop 912 is arranged to receive signal 964, to receive clock signal 948, to receive CLRZ signal 724, to output signal 966 and to output a signal 970.

XOR gate 916 is arranged to receive a signal 978 and a signal 972 as inputs and to output a signal 980. MUX 918 is arranged to receive signal 980 from XOR gate 916, to receive data 944, to receive load signal 952 and to output a signal 976. Specifically, MUX 918 selects one of signal 980 and data 944 to output as signal 976 based on the logic state of a pulse of load signal 952. Flip flop 920 is arranged to receive signal 976, to receive clock signal 948, to receive CLRZ signal 724, to output signal 978 and to output a signal 982.

AND gate 914 is arranged to receive, as inputs, signal 960 from flip flop 906 and enable signal 938 and to output signal 968 to XOR gate 908. AND gate 922 is arranged to receive, as inputs, signal 960 from flip flop 906, signal 970 from flip flop 912 and enable signal 938 and to output signal 972 to XOR gate 916. AND gate 924 is arranged to receive, as inputs, signal 960 from flip flop 906, signal 970 from flip flop 912, signal 982 from flip flop 920 and enable signal 938 and to output a signal 984.

NOR gate 926 is arranged to receive, as inputs, data 940, data 942 and data 944 and to output a signal 986.

NOR gate 930 is arranged to receive, as inputs, signal 958, signal 966 and signal 978 and to output signal 990. MUX 934 is arranged to receive, as inputs, signal 990, signal 984 and signal 986 and to output signal 992. Specifically, MUX 934 selects one of signal 984 and signal 990 to output as signal 992 based on the logic state of a pulse of signal 986. NOT gate 936 is arranged to receive signal 992 and to output signal 994.

Counter 900 may be used in any stage of a ripple of counters. For example, counter 900 may be used as swallow counter 704 or program counter 706, of FIG. 7. Counter 900 is particularly useful as a last stage in a series of counters. For purposes of explanation, presume that counter 900 corresponds to program counter 706 of FIG. 7. In such a case: data 940, data 942 and data 944 of FIG. 9 correspond to coarse divide ratio load data 732 of FIG. 7; clock signal 948 of FIG. 9 corresponds to scaled frequency signal 714 of FIG. 7; signal 994 of FIG. 9 corresponds to output signal 722 of FIG. 7; NOT gate 936 of FIG. 9 corresponds to inverter 708 of FIG. 7; signal 984 of FIG. 9 corresponds to carryout signal 718 of FIG. 7; and signal 992 of FIG. 9 corresponds to scaled frequency signal 720 of FIG. 7.

Each previous stage of a ripple of counters will have a carryout signal, e.g., signal 984. All previous carryout signals, and signal 984 in this case, are input into an OR gate (not shown). The output of such an OR gate is load signal 952. As such, if counter 900 were used as a single stage counter, then load signal 952 would be signal 984. For this reason, in FIG. 9, signal 984 is shown as being connected to load signal 952 via a dotted line.

The operation of counter 900 may be explained as follows.

Starting with flip flop 920, which corresponds to a most significant bit in coarse divide ratio load data 734, if flip flop 920 is in a one state, and flip flop 912 is in the one state, then flip flop 920 will hold at the one state. Alternatively, if flip flop 920 is in a zero state, and flip flop 912 is in the one state, then flip flop 920 will change to the zero state. If flip flop 920 is in a one state, and flip flop 912 or flip flop 906 are in the one state, then the output of flip flop 912 will not change and thus will stay in the one state. Alternatively, if flip flop 920 is in a zero state, and flip flop 912 or flip flop 906 are in the one state, then the output of flip flop 920 will hold to a zero state. If flip flop 920 is in a zero state, and flip flop 912 is in the zero state and flip flop 906 is in a one state, then the output of flip flop 920 will hold to a zero state. This operation is repeated for flip flop 906, flip flop 912 and flip flop 920 to count the output addresses down to zero.

Moving to flip flop 912, which corresponds to the next most significant bit in coarse divide ratio load data 734, if flip flop 912 is in a one state, and flip flop 906 is in the one state, then flip flop 912 will change to the zero state. Alternatively, if flip flop 912 is in a zero state, and flip flop 906 is in the one state, then flip flop 912 will hold the zero state. If flip flop 912 is in a 1 state, and flip flop 906 is in the zero state, then the output of flip flop 912 will change to the zero state. Alternatively, if flip flop 912 is in a zero state, and flip flop 906 is in the zero state, then the output of flip flop 912 will change to a one state.

Moving to flip flop 906, which is the least significant bit, its output toggles between one and zero state.

When each of flip flop 906, flip flop 912 and flip flop 920 is in the zero state, the output of AND gate 924 is high. In this case, signal 984 (and when the carry out signals of previous stages enable) switches load signal 952. Load signal 952 then instructs each of MUX 904, MUX 910 and MUX 918 to output data 940 on signal 956, to output data 942 on signal 964 and output data 944 on signal 976, respectively. At the next rising edge of clock signal 948, data 940, data 942 and data 944 are loaded into flip flop 906, flip flop 912 and flip flop 920, respectively. In other words, when each of flip flop 906, flip flop 912 and flip flop 920 is in the zero state, the divider data word containing the divide ratio is loaded.

MUX 904 selects signal 954 from XOR gate 902 or data 940 as input into the D input of flip flop 906. When signal 954 is selected, the effect is to count down. When data 940 is selected, the effect is to load data. Similarly, MUX 910 selects signal 962 from XOR gate 908 or data 942 as input into the D input of flip flop 912. When signal 962 is selected, the effect is to count down. When data 942 is selected, the effect is to load data. Finally, MUX 918 selects signal 980 from XOR gate 916 or data 944 as input into the D input of flip flop 920. When signal 980 is selected, the effect is to count down. When data 944 is selected the effect is to load data.

Signal 984 enables the next state in a divider chain, if there is a next state in a divider chain. Signal 986 deals with a case in which data 940, data 942 and data 944 are all zeroes. In such a case, signal 986 instructs MUX 934 to output signal 984. In such a situation, output signal 994 can go high depending on the enable from the previous stages.

There may be an instance when divide ratio load data for the last counter consists of all zeros. In such a case, in accordance with counter 900, if data 940, data 942 and data 944 of the last stage is all zeroes, output signal 994 will not have a rising edge. Counter 900 uses a carryout signal of previous stage as enable signal 938 to cause a rising edge at output signal 994. Accordingly, data 940, data 942 and data 944 are ignored until signal 958 from flip flop 906, signal 966 from flip flop 912 and signal 972 from flip flop 920 are all zero. Such an event will load ones into AND gate 924. Assuming enable from signal 938, everything is zero. AND gate 924 will output signal 984 as a one, which connects to load signal 952 (and will be appropriately ORed with previous stages). At this point, load signal 952 instructs MUX 904, MUX 910 and MUX 918, wherein: MUX 904 loads data 940 into flip flop 906 via signal 956; MUX 910 loads data 942 into flip flop 912 via signal 964; and MUX 918 loads data 944 into flip flop 920 via signal 976. In such a case: data 940 will output from flip flop 906 as signal 958; data 942 will output from flip flop 912 as signal 966; and data 944 will output from flip flop 920 as signal 978.

As a more practical and concise description of the operation of counter 900, when a rising edge occurs in CLRZ signal 724, a rising edge occurs in load signal 952 after a short delay. Then a rising edge in output signal 994 follows. The rising edge in CLRZ signal 724, the rising edge in load signal 952, and the rising edge in output signal 994 of counter 900 occur independently from clock signal 948. In other words, counter 900 does not need to wait for a rising edge in clock signal 948 to make load signal 952 go high, or to change output signal 994 from low to high. Therefore, in accordance with an aspect of the present invention, counter 900 asynchronously puts a rising edge on output signal 994.

Figure 10:
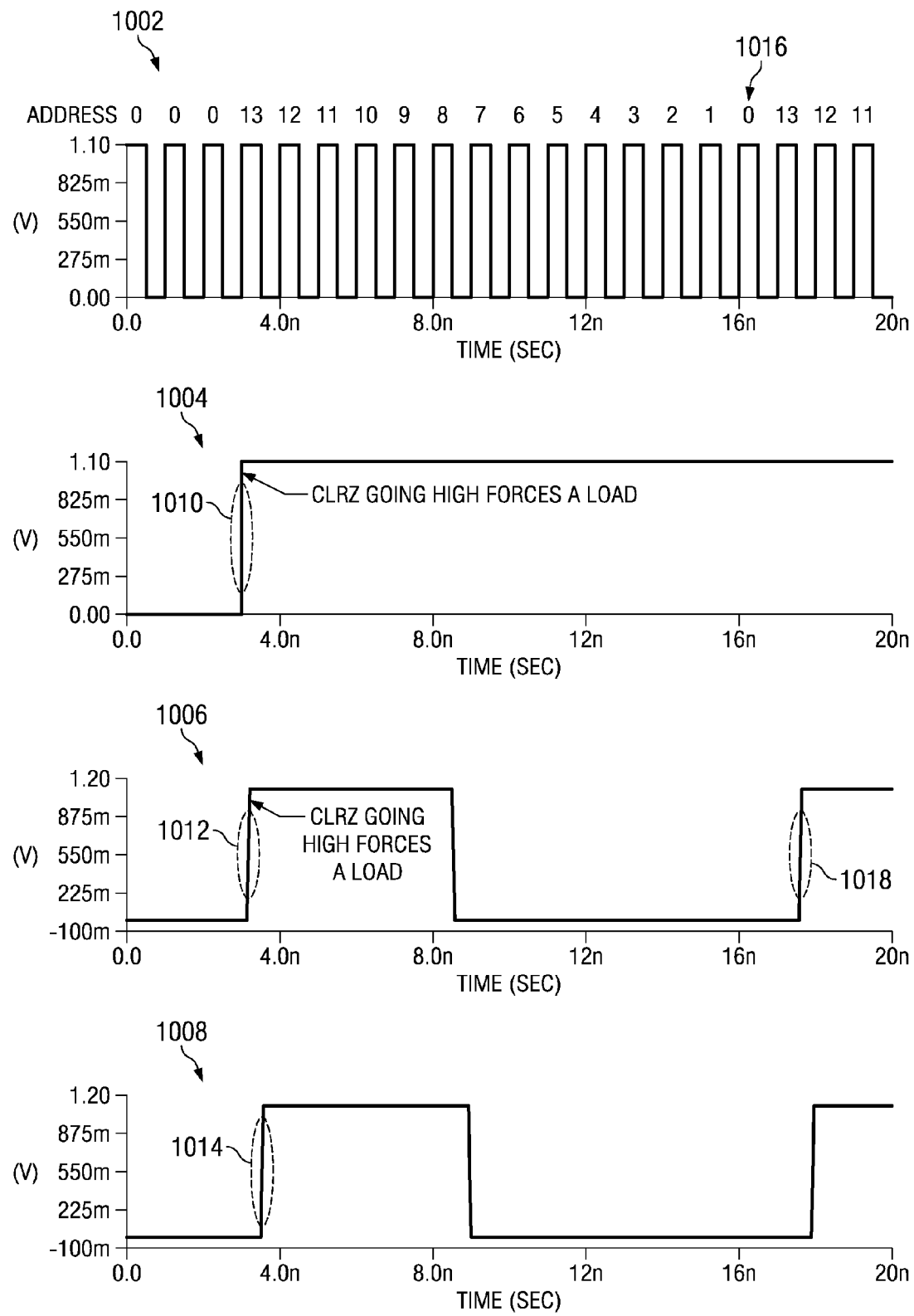
FIG. 10 shows a SPICE simulation of an example of divider timing that occurs when CLRZ goes from low to high to force a load condition and a rising edge at the divider output after the load command was low.

FIG. 10 shows a SPICE simulation of an example of countdown-to-zero divider timing that occurs when a CLRZ signal goes from low to high to force a load condition and a rising edge at the divider output after the load command was low. Waveform 1002 shows the input clock to the divider (referring back to FIG. 7, input signal 712). Waveform 1004 shows the CLRZ signal (referring to FIG. 7, CLRZ 730). Waveform 1006 shows the LOAD command signal and waveform 1008 shows the divide by N output of the counter (output signal 722). In the divider shown in FIG. 10, the divider ratio N is 13.

In the figure, when a rising edge 1010 of the CLRZ signal occurs, a rising edge 1012 occurs in the LOAD command after a short delay. Then a rising edge 1014 of the output of the counter follows. As shown in FIG. 10, rising edge 1010 of the CLRZ signal, rising edge 1012 of the LOAD command, and rising edge 1014 of the output of the counter occur independently from the input clock (waveform 1002). Accordingly, as discussed above with reference to FIG. 9, the divider does not need to wait for a rising edge of the input clock to make the LOAD command signal go high, or to change of the output of the counter from low to high.

Using count-down-to-zero counters for frequency dividers makes loading the divide ratio data occur on the first clock edge after the counters are in the zero address state. This is illustrated in FIG. 10, as follows. When the CLRZ signal state is low, the counter in the divider is in the zero address state and the divider output is disabled (logic level low). When the CLRZ signal state goes high (end of hold state, rising edge 1010 of the CLRZ signal), it forces the LOAD command signal to go high (rising edge 1012 of the LOAD command signal) and the divider output to go high (rising edge 1014 of the output of the counter). When the LOAD command signal goes high (rising edge 1012 of the LOAD command signal), from waveform 1002 it is clear that the address of the counter is loaded to 13, which is the divide ratio, N. With each cycle of the input clock, the counter counts down from 13 until it eventually counts clown to zero address state (point 1016). At this point, the LOAD command signal goes high again (rising edge 1018 of the LOAD command signal) and the divide ratio of 13 is reloaded back into the counter. Thus, by using count-down-to-zero counters in this divider, it is ensured that the loading of the divide ratio data always occurs after the counter is in the zero address state. Otherwise, if count-up counters were used, once the counter was in zero address state, a rising edge in CLRZ signal would not cause a rising edge in the LOAD command signal, and the divider would not initialize properly.

FIG. 10 can be further discussed in terms of the reference and feedback dividers in PLL system 500 of FIG. 5. When the CLRZ signal state is low (a pulse of CLRZ signal 566 is low), reference signal 536 from reference divider 506 and divided feedback signal 538 from feedback divider 508 are both low. While CLRZ signal state is low, PLL system 500 is in the hold condition, and functions to maintain constant frequency of output signal 504. When the hold condition ends, by CLRZ signal state going high (a rising edge of a pulse of CLRZ signal 566, indicated by rising edge 1010 of CLRZ signal), this indicates the relock command. The LOAD command signal for both reference divider 506 and feedback divider 508 is forced to go high (rising edge 1012 of the LOAD command signal), which will allow new divide ratios M and N to be loaded into reference divider 506 and feedback divider 508 upon the next rising edge of their respective inputs.

Since the hold state occurred when PLL system 500 was locked, the rising edge of a pulse within signal 502 to reference divider 506 and the rising edge of a pulse within output signal 504 into feedback divider 508 are synchronous. Consequently, counters within reference divider 506 and counters within feedback divider 508 load their divide ratio data synchronously. Furthermore, since reference divider 506 and feedback divider 508 are both controlled by CLRZ signal 566, the output of each divider is enabled (rising edge 1014 of the output of the counter) at the same time, resulting in divided reference signal 536 and divided feedback signal 538 having their rising edges aligned going into phase detector 510. This allows for ZPS upon relock of PLL system 500. Any change in frequency of output signal 504 during the hold state will then be measured within the next clock cycle, i.e., the first phase error measurement after the relock state has started.

Figure 11:
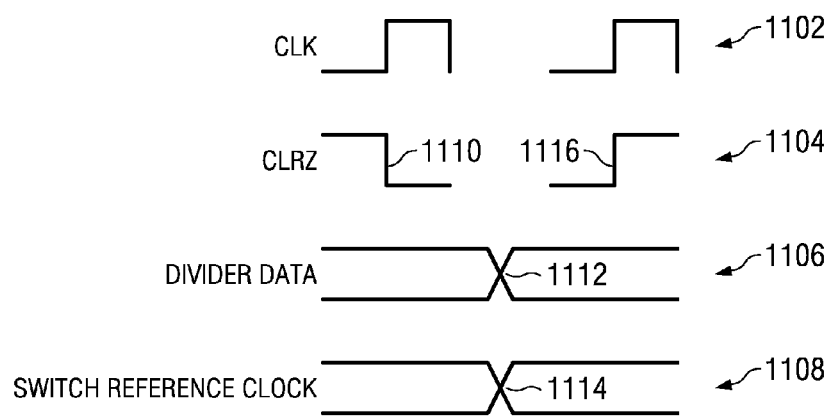
FIG. 11 illustrates the general timing description of PLL system 500 in present invention.

PLL system 500 can have a zero phase start with the existing logic by creating a state machine controller that uses CLRZ signal 566 and has the timing shown in FIG. 11.

FIG. 11 illustrates a general timing description of PLL system 500 in accordance with an aspect of the present invention. FIG. 11 includes a CLK signal waveform 1102 corresponding to a system clock, a CLRZ signal waveform 1104 corresponding to CLRZ signal 566, a divider data signal waveform 1106 corresponding to both of divided reference signal 536 and divided feedback signal 538, and a reference clock switching waveform 1108.

In the figure, when the CLRZ signal goes low (point 1110) PLL system 500 holds the frequency of output signal 504 constant. During the hold state, divided reference signal 536 and divided feedback signal 538 and the reference clock can be changed at any time (indicated by point 1112 and point 1114, respectively) before CLRZ signal 566 goes high (point 1116). Once CLRZ signal 566 goes high, the hold period is over and the relock period begins.

Figure 12:
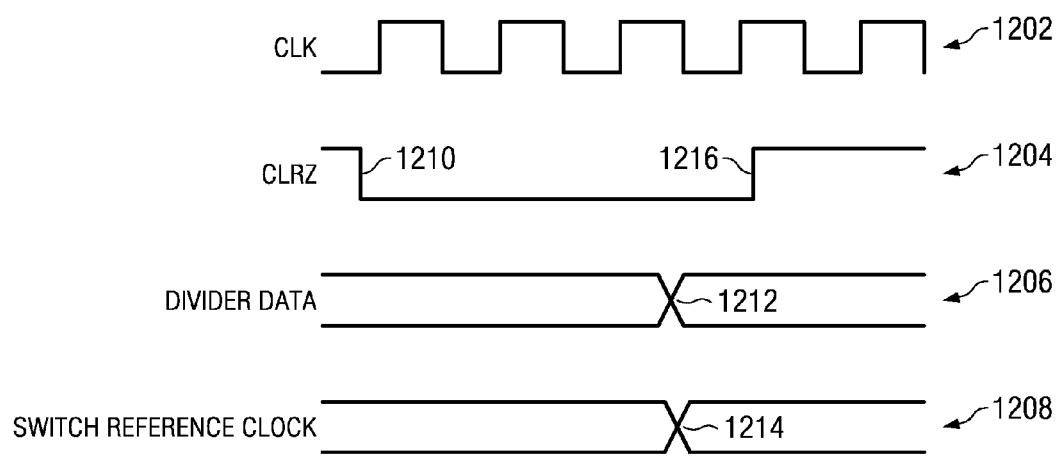
FIG. 12 illustrates example timing diagrams for controlling the dividers in PLL system 500 in the present invention.

FIG. 12 illustrates example timing diagrams for controlling reference divider 506 and feedback divider 508 in PLL system 500 in accordance with an aspect of the present invention. FIG. 12 includes a CLK waveform 1202 corresponding to the system clock, CLRZ waveform 1204 corresponding to CLRZ signal 566, divider data waveform 1206 corresponding to both of divided reference signal 536 and divided feedback signal 538, and reference clock switching waveform 1208. When CLRZ signal 566 goes low (point 1210), PLL system 500 holds the frequency of output signal 504 constant. During the hold state, divider data waveform 1206 and reference clock switching waveform 1208 are changed three-clock periods later (points 1212 and 1214, respectively) to avoid metastability. On the fourth edge of CLK waveform 1202, CLRZ waveform 1204 goes high (point 1216). Once CLRZ waveform 1204 goes high, the hold period is over and the relock period begins.

Operation of PLL system 500 illustrated in FIG. 5 will now described below with further reference to FIG. 13.

Figure 13:
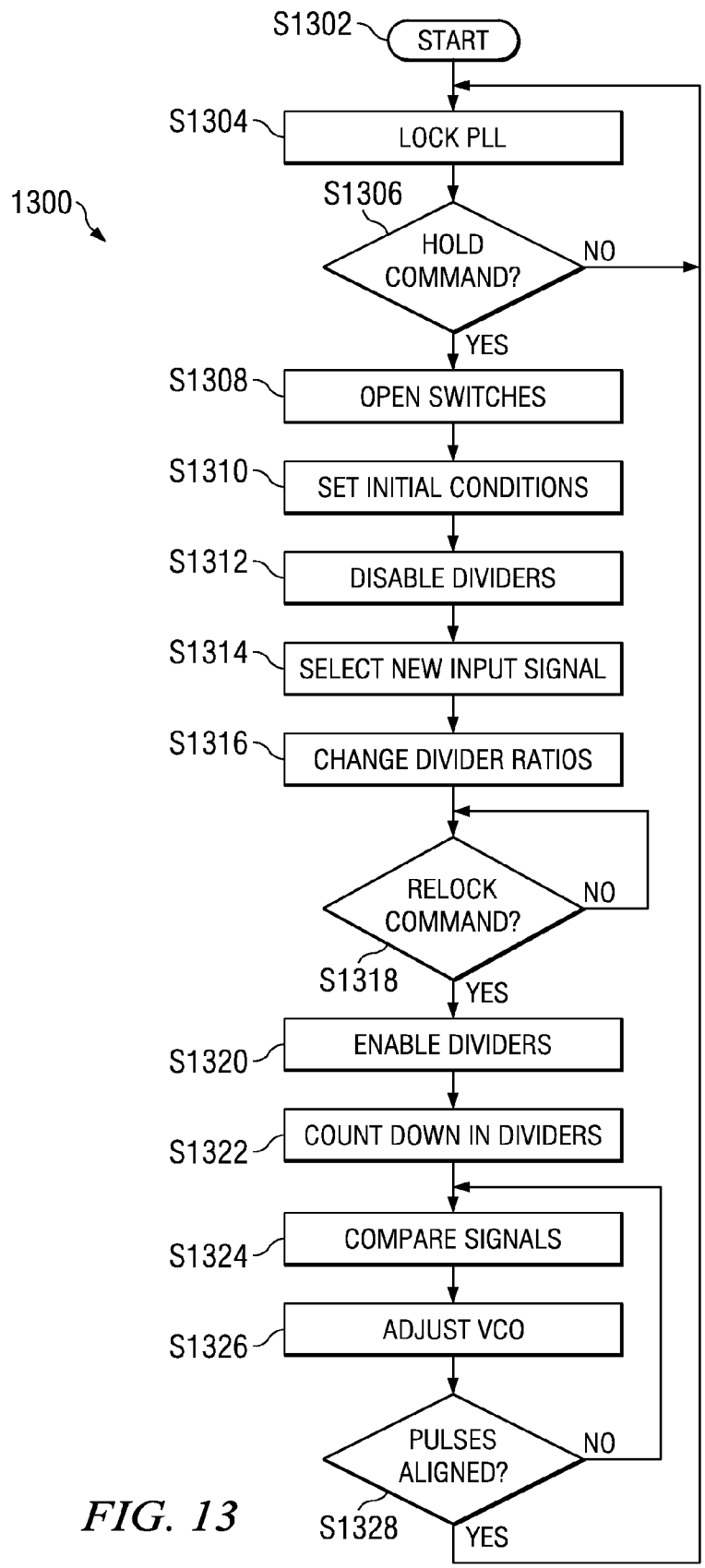
FIG. 13 is a flowchart of an algorithm 1300 of operating a PLL system in accordance with an aspect of the present invention.

FIG. 13 is a flowchart of an example method 1300 of operating PLL system 500 in accordance with an aspect of the present invention. Algorithm 1300 starts (S1302) and PLL system 500 is locked such that the positive edge of divided reference signal 536 and the positive edge of divided feedback signal 538 going into phase detector 510 are aligned (S1304).

It is then determined whether a hold command occurs (S1306). If no hold command occurs, PLL system 500 stays in the locked state. If a hold command occurs, switches 516 and 518 are opened so that voltage on storage capacitors 524 and 530 in loop filter 512 can be held constant (S1308).

Then, PLL system 500 begins to setup initial conditions by setting reference and feedback dividers to a "0" address state (S1310). Referring to FIG. 5, CLRZ signal 566 goes low, which set the addresses of counters inside reference divider 506 and feedback divider 508 to 0.

At this point, dividers outputs are disabled to a low level for the current hold state (S1312). Referring to FIG. 5, when CLRZ signal 566 goes low, divided reference signal 536 of reference divider 506 and divided feedback signal 538 of feedback divider 508 are forced to logic-level low.

Then a new input signal is provided (S1314). For example, a new crystal oscillator with different frequency may be selected to provide a new input signal to reference divider 506 to provide a different reference input frequency. Referring to FIG. 5, the existing crystal oscillator (not shown) that provides reference input signal 502 to reference divider 506 is replaced with a new crystal oscillator (not shown) with a different frequency. The frequency of the new crystal oscillator is determined by the state machine logic inside reference divider 506.

After the crystal oscillator frequency is changed, the reference divider ratio and feedback divider ratio must be changed (S1316), such that upon relocking, the output frequency remains constant. Referring to FIG. 5, the divide ratio M of reference divider 506 and divide ratio N of feedback divider 508 are changed to appropriate values such that divided reference signal 536 and divided feedback signal 538 are the same, thus unchanging the frequency of output signal 504.

After the divider ratios are changed, It is then determined whether a relock command occurs (S1318). If a relock command does not occur, PLL system 500 remains in a hold condition and continues waiting for relock command.

If a relock command does occur, the outputs of dividers are enabled so that there is a concurrent transition from a low level to a high level into both inputs of the phase detector (S1320). Referring to FIG. 5, CLRZ signal 566 goes from low to high, which results in divided reference signal 536 transitioning from low to high and divided feedback signal 538 transitioning from low to high. The outputs of both reference divider 506 and feedback divider 508 are therefore concurrently enabled.

At this point, new divide ratios are loaded into the dividers, and the dividers are enabled to count down with each clock edge (S1322). Referring to FIG. 5, the new divide ratio M for reference divider 506 and divide ratio N for feedback divider 508 (calculated in step S1314) are loaded into their respective dividers. The counters inside reference divider 506 and feedback divider 508 start counting clown at each clock edge, as discussed above with reference to FIG. 7.

Phase detector then compares the rising edges of its two inputs (step S1324). Referring to FIG. 5, phase detector 510 receives divided reference signal 536 from reference divider 306 and divided feedback signal 538 from feedback divider 508, and measures the phase difference.

Based on the measured phase difference, the control voltage of the voltage controlled oscillator is then adjusted to change the positive edge of feedback divider output to the phase detector (S1326). Referring to FIG. 5, if phase detector 510 detects a non-zero phase difference between divided reference signal 536 and divided feedback signal 538, the pulses on UP signal 540 and DOWN signal 542 work to change the voltage on Vtune 572 such that the frequency of output signal 504 adjusts, such that divided feedback signal 538 becomes more in phase with divided reference signal 536.

The phase detector then again determines if the rising edges of its inputs are aligned (S1328). Referring to FIG. 5, phase detector 510 re-measure the phase difference to evaluate if the rising edges of divided reference signal 536 and divided feedback signal 538 are aligned. If the edges are aligned (zero phase difference), the pulses on UP signal 540 and DOWN signal 542 are identical, which results in zero transfer of charge to storage capacitors 524 and 530, and Vtune 572 (and therefore output signal 504) is unchanged. Here, the PLL system 500 is considered (re-)locked and thus goes back to step S1304. However, if divided reference signal 536 and divided feedback signal 538 of phase detector 510 are still not aligned going into phase detector 510, PLL system 500 will return to step S1324 to perform further adjustments until it is locked.

Figure 14:
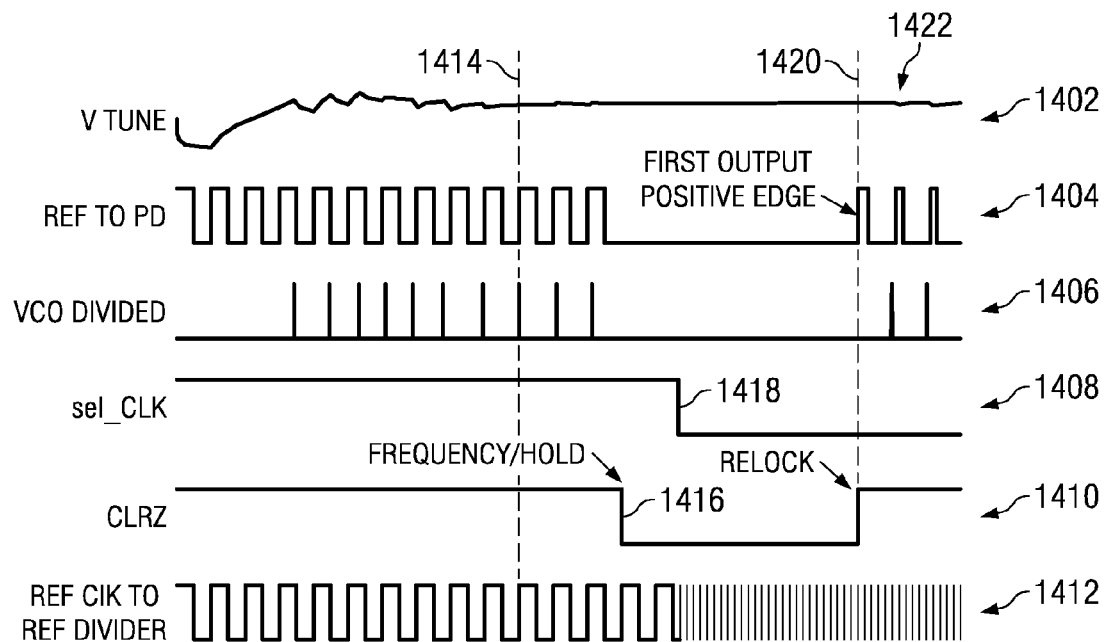
FIG. 14 shows an example simulation of a PLL system 500 in accordance with the present invention, in which the reference input clock is dynamically changed.

FIG. 14 shows example simulation signals within PLL system 500 in accordance with the present invention, in which the reference input clock is dynamically changed. FIG. 14 includes six waveforms 1402, 1404, 1406, 1408, 1410 and 1412, each illustrating a voltage signal as a function of time. Waveform 1402 shows the control voltage, Vtune 572, to VCO 560. Waveform 1404 shows divided reference signal 536 that is output from reference divider 506. Waveform 1406 shows divided feedback signal 538 that is output from feedback divider 508. Fourth waveform 1408 illustrates the selection of the reference input signal 502. Fifth waveform 1410 illustrates CLRZ signal 566 to reference divider 506 and feedback divider 508. Waveform 1412 shows reference input signal 502 that is input to reference divider 506.

In waveform 1402, initially there are large changes in Vtune 572 due to the large phase difference between waveforms 1404 and 1406. However, by about 320 μs (time point 1414), one can see that waveform 1406 (divided feedback signal 538) has become locked to waveform 1404 (divided reference signal 536), and waveform 1402 (Vtune 572) is more or less stable. PLL system 500 remains in the lock condition until shortly after 400 μs (time point 1416), where waveform 1410 (CLRZ signal 566) goes low. This causes waveform 1404 and waveform 1406 to be disabled (go low). Note that despite the divider outputs being disabled, waveform 1402 (Vtune 572) remains stable, holding the frequency of output signal 504.

During the hold state, at around 450 μs (time point 1418), waveform 1408 switches from high to low, signaling a change in the frequency of the reference input signal 502. This can be clearly seen in waveform 1412, where at time point 1418, the frequency changes from a slow clock to a very fast clock. At this point, PLL system 500 still remains in the hold state, and waveform 1402 (Vtune 572) continues to remain constant. The divider outputs (waveform 1404 and waveform 1406) remain disabled until the relock command occurs via a rising edge in waveform 1410 (CLRZ signal 566), at about 620 μs (time point 1420). Immediately after this, the rising edges of waveform 1404 (divided reference signal 536) and rising edge of waveform 1406 (divided feedback signal 538) are concurrently enabled. This provides for ZPS, such that no phase error is measured by phase detector 510 immediately upon relock. This allows waveform 1402 (Vtune 572) to remain constant and free from glitches.

Also, by forcing ZPS upon relock, any actual phase error that may have occurred due to charge leaking off storage capacitors 524 and 530 during the hold state is effectively measured by the next clock cycle. This can be seen in waveform 1402, at about 660 μs (time point 1422), which is one reference clock cycle after the divider outputs were enabled. At time point 1422, one can see the ripple in waveform 1402 (Vtune 572), which indicates the small amount of phase correction needed to correct output signal 504 such that waveform 1406 (divided feedback signal 538) is again completely in phase with waveform 1404.

The example circuit in accordance with an aspect of present invention shown in FIG. 5 significantly eliminates the leakage of the storage capacitor in hold state and reduces the phase error when the circuit state is changed to relock. However, the present invention discussed above has not addressed the problem that typically arises upon dynamic switching from a fast clock to a slow clock (e.g., 32 kHz). When using a 32 kHz clock, complications arise because further frequency division of the low frequency clock (via the reference divider) significantly degrades the PLL performance by increasing phase noise and sideband levels. To overcome this issue, another aspect in accordance with the present invention based on the example circuit 500 in FIG. 5 is introduced in below.

Another aspect in accordance with the present invention includes circuitry to hold the frequency with a minimum of change during the hold period, to minimize the peak frequency change and relocking time during reacquisition, to synchronize the rising edges into the phase detector, when the reference clock is switched from high frequency to low frequency. A block diagram for an example circuit in accordance with this aspect of the present invention is given in FIG. 15.

Figures 15, 15A:
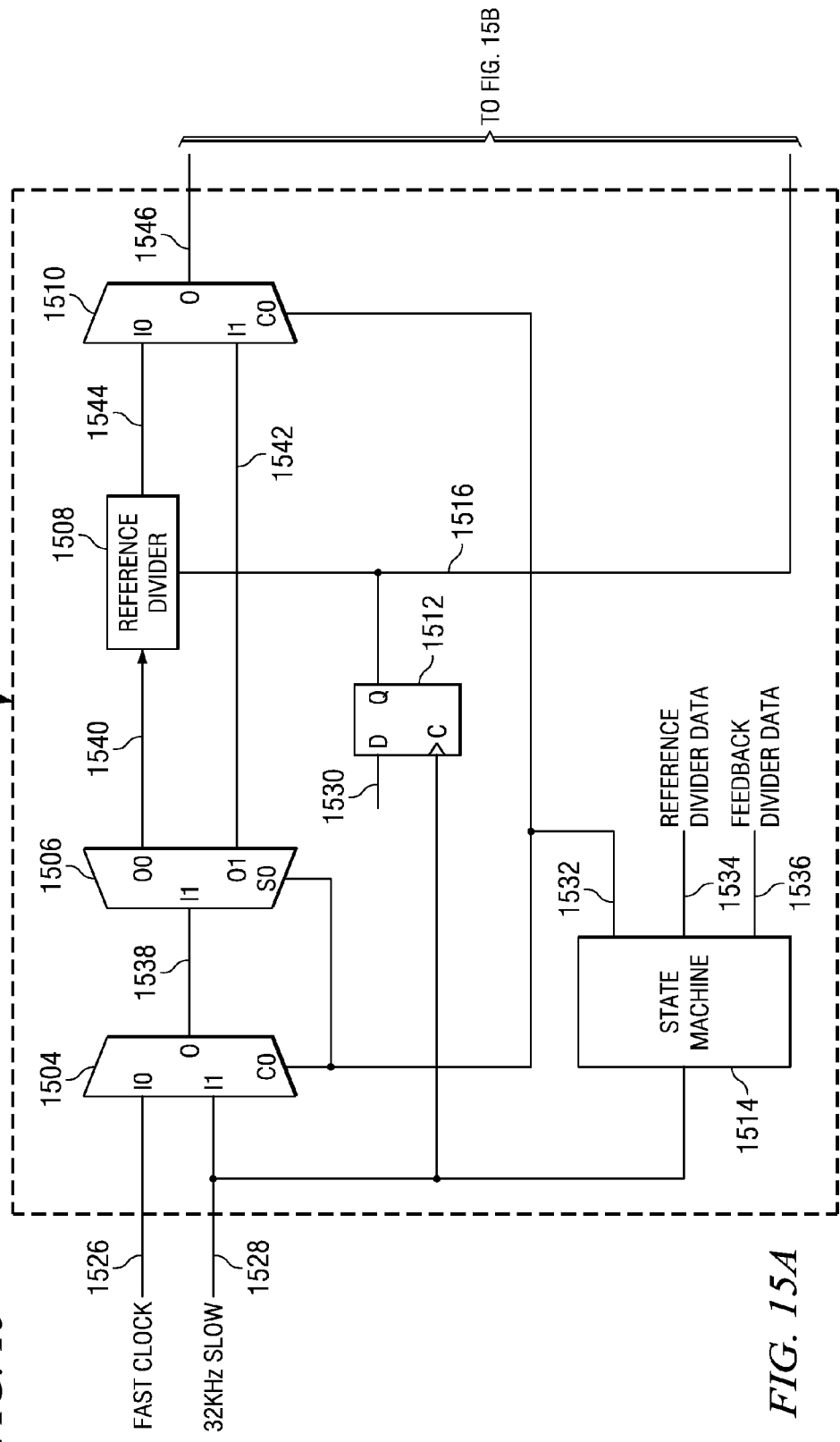
FIG. 15 illustrates an example PLL system 1500 in accordance with an aspect of second present invention.
Figure 15B:
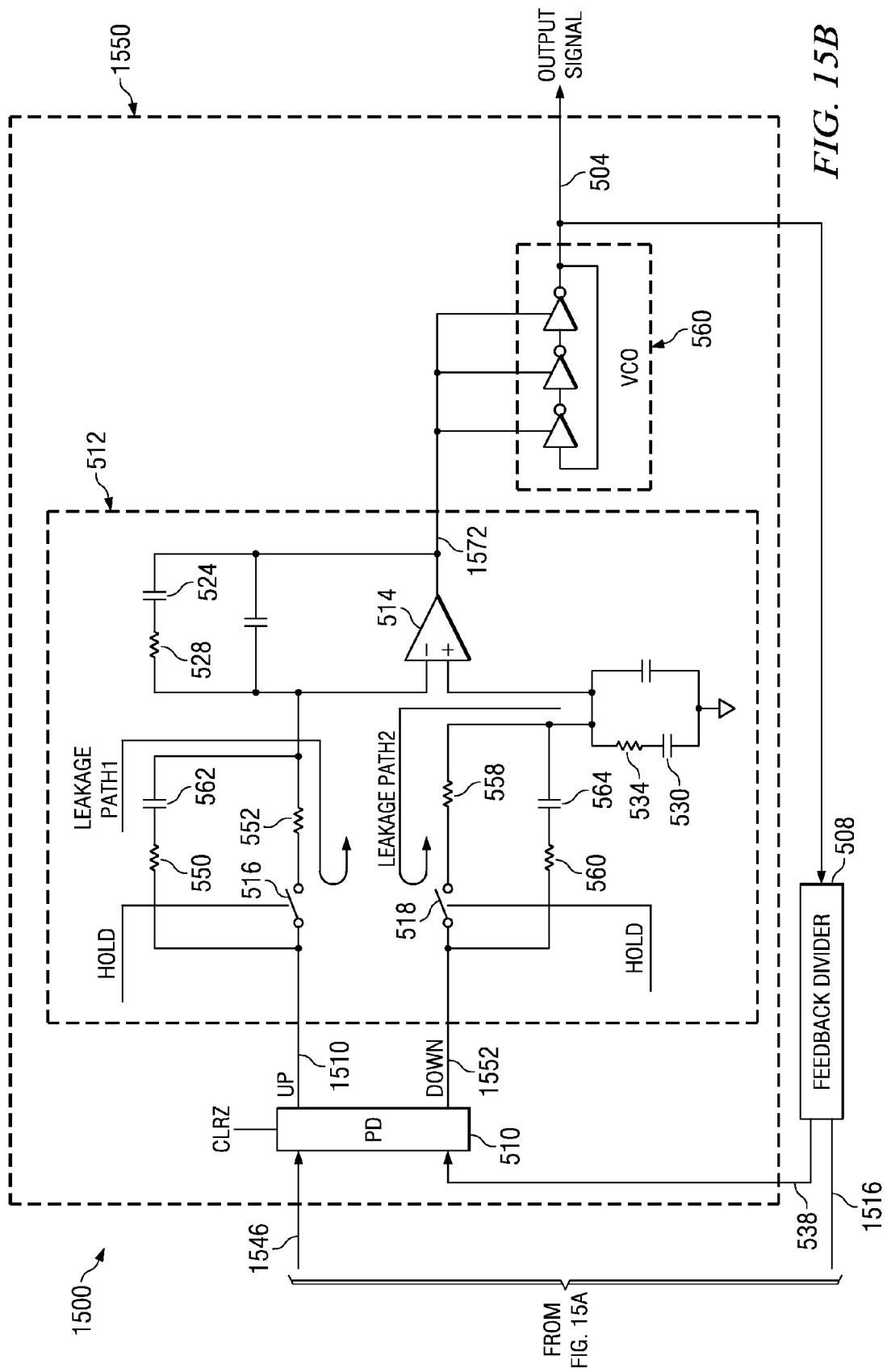

FIG. 15 illustrates an example PLL system 1500 in accordance with an aspect of the present invention. As illustrated in the figure, PLL system 1500 differs to PLL system 500 in FIG. 5, in that PLL system 1500 additionally includes a synchronization portion 1502. Synchronization portion 1502 includes multiplexer 1504 and multiplexer 1510, a De-multiplexer 1506, a programmable counter 1508, a synchronous flip flop 1512, and a state machine 1514. The portions of PLL system 1500 in common with PLL system 500 will not be described in detail to reduce redundancy.

Multiplexer 1504 is arranged to receive a clock input signal 1526 and a clock input signal 1528 as inputs and to output clock signal 1538 to de-multiplexer 1506. In an example embodiment, clock input signal 1526 comprises a 19.2 MHz signal and clock input signal 1528 comprises a 32 kHz signal. Multiplexer 1504 is further arranged to receive select signal 1532 as selection input. De-multiplexer 1506 is arranged to receive clock signal 1538 as input and to receive a select signal 1532 as a selection input. De-multiplexer is further operable to output a fast clock signal 1540 to reference divider 1508 and to output an undivided reference clock signal 1542 to multiplexer 1510.

Reference divider 1508 is arranged to receive fast clock signal 1540 from De-multiplexer 1506 and to output a divided reference signal 1544 to multiplexer 1510.

Multiplexer 1510 is arranged to receive divided reference signal 1544 and undivided reference clock signal 1542 signal as an inputs. Multiplexer 1510 is additionally arranged to receive select signal 1532 as the selection input and to output selected reference input signal 1546 to phase detector 510.

Synchronous flip flop 1512 is arranged to receive asynchronous CLRZ signal 1530 as data input, to receive clock input signal 1528 as clock input and to output synchronous CLRZ signal 566 to reference divider 1508 and feedback divider 508.

State machine 1514 is arranged to receive slow clock signal 1528 as an input and to output select signal 1532 to multiplexers 1504 and 1510 and to de-multiplexer 1506. State machine 1514 updates data for each of reference divider 1508 and feedback divider 508 via data lines 1534 and 1536, correspondingly.

Feedback divider 508 is additionally arranged to receive synchronous CLRZ signal 566 from synchronous flip flop 1512.

In operation, switches 516 and 518 are nominally closed. A high frequency reference clock (clock input signal 1526) and slow frequency reference clock (clock input signal 1528) are provided by external crystal oscillators (not shown). Multiplexer 1504, de-multiplexer 1506, and multiplexer 1510 are used to select between clock input signal 1528 and clock input signal 1526. Multiplexer 1510 also works to isolates the two clock signals to minimize spurious signals at the output of PLL system 1500.

Reference divider 1508 produces divided reference signal 1544, which has the frequency of fast clock signal 1540 divided by an integer ratio M. Note that multiplexor 1504 and de-multiplexor 1506 are arranged such that only fast clock signal 1540 is divided by reference divider 1508. The slow reference input, undivided reference clock signal 1542, bypasses reference divider 1508, which avoids the degradation of PLL performance that would result upon further division of the slow clock frequency.

State machine controller 1514 generates timing control for PLL system 1500. Synchronous flip flop 1512 synchronizes the CLRZ (clear on logic level low) input signal (asynchronous CLRZ signal 1530) and provides for a synchronous CLRZ signal 566 that is synchronous with clock input signal 1528.

The basic operation of PLL system 1500 is very similar to that of PLL system 500. However, PLL 1500 differs in that it includes synchronization portion 1502 which enables PLL 1500 to dynamically switch between a slow reference clock and a fast reference clock. Specifically, synchronization portion 1502 accomplishes this by utilizing both a slow clock input, i.e., clock input signal 1528, and a fast clock input, i.e., clock input signal 1526. Even when clock input signal 1526 is selected to be used as the reference signal, clock input signal 1528 is still used to synchronize state machine 1514 and to generate a synchronous CLRZ signal 566 that is supplied to both reference divider 1508 and feedback divider 508. In this manner, when switching from a fast reference clock to a slow reference clock, the rising edges of selected reference input signal 1546 and divided feedback signal 538 going into phase detector 510 can be synchronized, providing for ZPS upon relock. Furthermore, when a slow reference clock is selected, i.e., clock input signal 1528, multiplexors 1504 and 1510 and de-multiplexor 1506 allow clock input signal 1528 to bypass reference divider 1508, which avoids an increase in phase noise and sideband levels. More particularly, if reference divider 1508 were used, then a higher divide ratio would be needed at phase detected 510. A higher divide ratio would have a corresponding increase in phase noise and sideband levels. By bypassing reference divider 1508, a lower divide ratio may be used from feedback divider 508, which would decrease phase noise and sideband levels.

As mentioned above, upon switching between low and high frequency reference clocks, PLL system 1500, provides for ZPS using a synchronized state machine 1514 and synchronous CLRZ signal 566. The logic and timing controls of state machine 1514 can be discussed through the timing diagram shown in FIG. 16.

Figure 16:
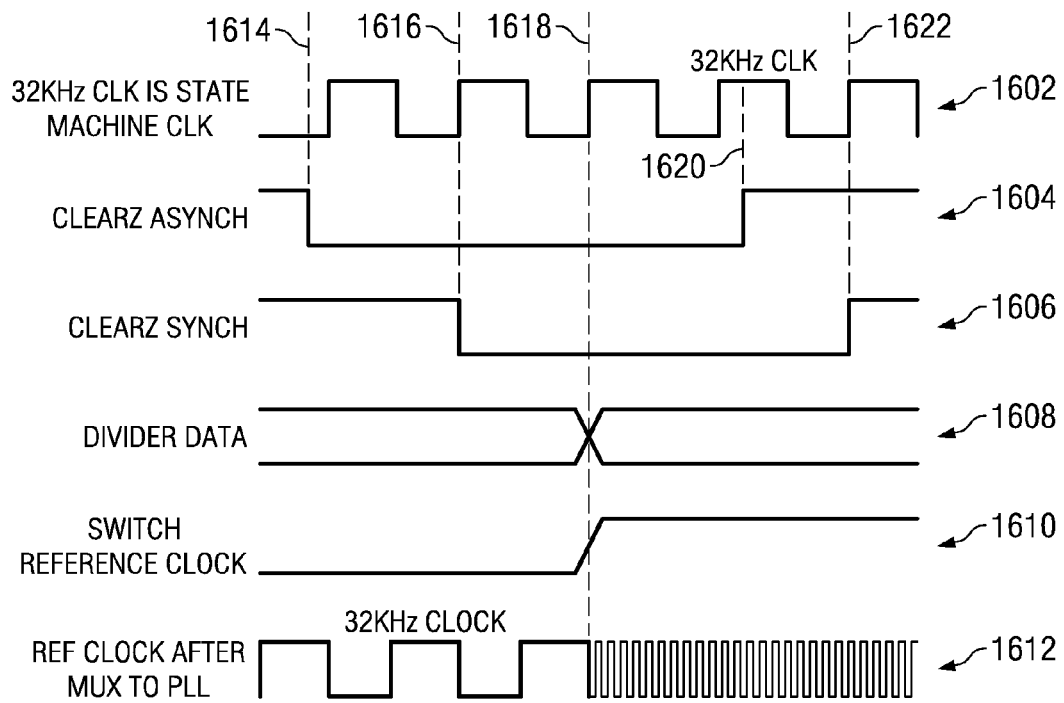
FIG. 16 illustrates an example of system timing of state machine 1514 in FIG. 15, in accordance with the second invention.

FIG. 16 illustrates an example of system timing of state machine 1514 in FIG. 15, in accordance with an aspect of the present invention. FIG. 16 includes six waveforms illustrating voltages as a function of time: a 32 kHz clock waveform 1602, an asynchronous CLRZ waveform 1604, a synchronous CLRZ waveform 1606, a divider data waveform 1608, a reference switching waveform 1610, and a selected reference clock waveform 1612. Referring to PLL system 1500 of FIG. 15, 32 kHz clock waveform 1602 corresponds to clock input signal 1528, asynchronous CLRZ waveform 1604 corresponds to asynchronous CLRZ signal 1530, synchronous CLRZ waveform 1606 corresponds to synchronous CLRZ signal 566, divider data waveform 1608 corresponds to both data lines 1534 and 1536, switching reference waveform 1610 corresponds to select signal 1532 and selected reference clock waveform 1612 corresponds to selected reference input signal 1546.

As shown in selected reference clock waveform 1612, initially PLL system 1500 is using a slow clock (clock input signal 1528) for selected reference input signal 1546. Then, as shown in asynchronous CLRZ waveform 1604, at time point 1614, asynchronous CLRZ signal 1530 goes low, signaling the hold command. Switches 516 and 518 do not open until the next rising edge of clock input signal 1528, when synchronous CLRZ signal 566 goes low (labeled as time point 1616, shown by falling edge of synchronous CLRZ waveform 1606).

As long as synchronous CLRZ signal 566 is low, switches 516 and 518 are open, and VCO 560 continues to provide output signal 504, but has no control on the loop. In addition, during this period, any changes in the outputs of reference divider 1508 and feedback divider 508 will not affect the loop. Therefore, while switches 516 and 518 are open (synchronous CLRZ waveform 1606 is low), the reference clock is changed to a fast clock (by changing select signal 1532, as illustrated in waveform 1610, at time point 1618).

Once select signal 1532 is changed, multiplexer 1510 switches its output from slow clock to fast clock, such that selected reference input signal 1546 is now a fast clock, as shown in the second half of waveform 1612. Also at this time, the divide ratio data for reference divider 1508 and feedback divider 508 are changed (as shown by change in divider data waveform 1608). The new data then stays in the inputs of reference divider 1508 and feedback divider 508 and waits for the rising edge of synchronous CLRZ waveform 1606 to be loaded in.

Three cycles of 32 kHz clock 1502 after asynchronous CLRZ waveform 1604 went low (at time point 1614) in order to avoid metastability, asynchronous CLRZ waveform 1604 goes high (time point 1620). Then, after the next rising edge of 32 kHz clock waveform 1602, rising edge of synchronous CLRZ waveform 1606 goes high (time point 1622), signaling the relock command. Here, the new divide ratio data is loaded into reference divider 1508 and feedback divider 508, and their respective outputs are concurrently enabled. In this manner the rising edges of selected reference input signal 1546 and divided feedback signal 538 are aligned and there is zero phase error going into phase detector 510.

The operation of PLL system 1500 for dynamic switching between a slow and fast clock will now be described below with reference to FIG. 17.

Figure 17:
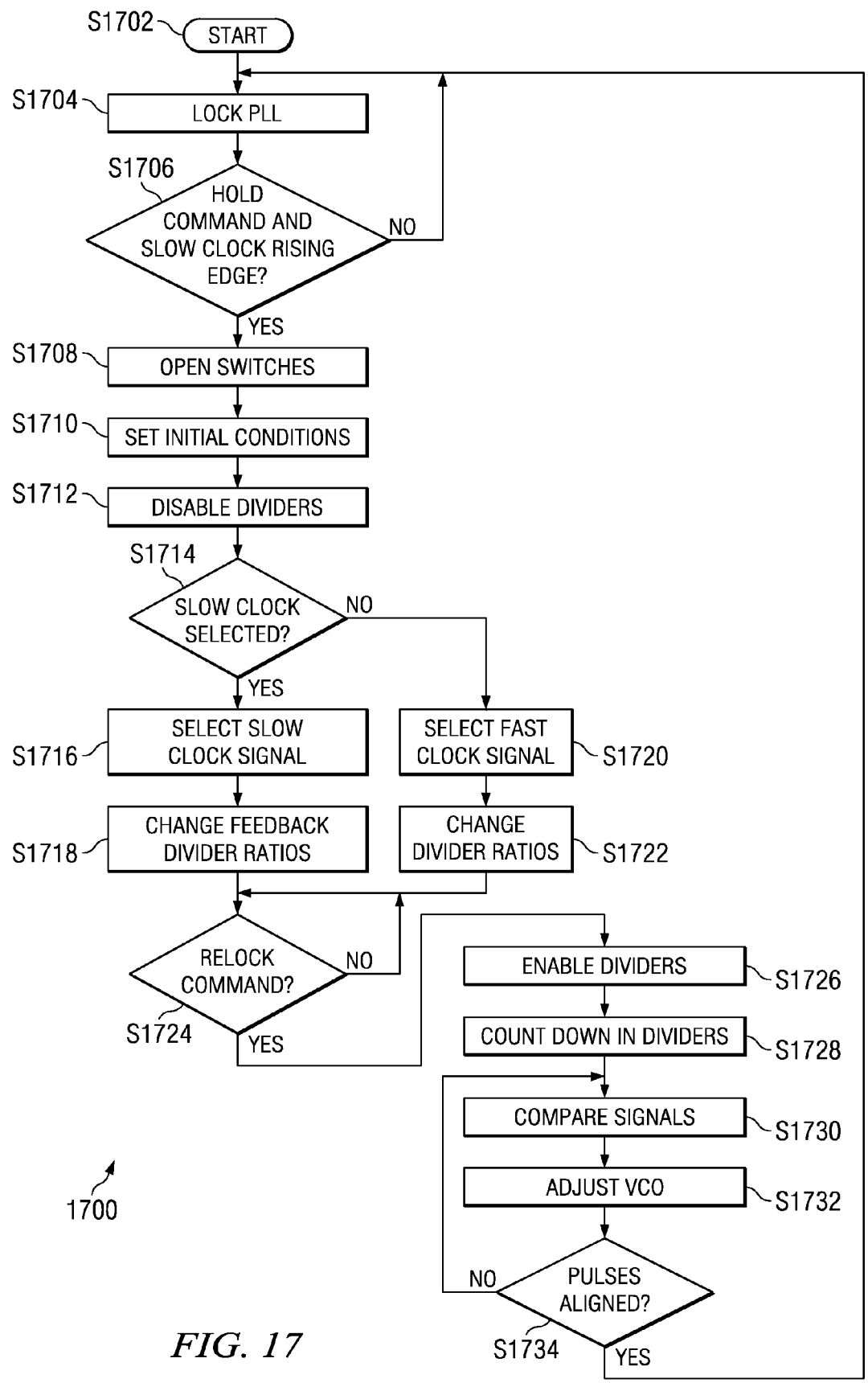
FIG. 17 is a flowchart illustrating an algorithm 1700 of operating PLL system 1500 in accordance with an aspect of the second invention.

FIG. 17 is a flowchart of an example method 1700 of operating PLL system 1500 in accordance with an aspect of the present invention. Algorithm 1700 starts (S1702) and PLL system 1500 is locked and the positive edge of selected reference input signal 1546 and the positive edge of divided feedback signal 538 going into phase detector 510 are aligned. Further, the counters within reference divider 1508 and feedback divider 508 count back to a zero address state. At this point, state machine 1514 loads new data words reference divider 1508 and feedback divider 508 via data lines 1534 and 1536, respectively (S1704).

Next, it is determined whether a hold command occurs, signaled by synchronous CLRZ signal 566 going low (S1706). If no hold command is detected (synchronous CLRZ signal 566 still high), PLL system 1500 goes back to step S1702. Otherwise, synchronous CLRZ signal 566 going low causes switches 518 and 516 to open, so that voltages on storage capacitors 524 and 530 in loop filter 512 remain constant (S1708).

At this point, PLL system 1500 begins to setup initial conditions by setting reference and feedback dividers to a zero address state (S1710). Referring to FIG. 15, synchronous CLRZ signal 566 going low sets the addresses of counters inside reference divider 1508 and feedback divider 508 to zero.

After setting up initial conditions, reference and feedback dividers outputs are disabled to a low level for the current hold state (S1712). Referring to FIG. 5, when synchronous CLRZ signal 566 goes low, divided reference signal 1544 of reference divider 1508 and divided feedback signal 538 of feedback divider 508 are forced to logic-level low.

It is now determined whether the slow clock is selected, i.e., if select signal 1532 is high, (S1714). If the slow clock is selected, PLL system 1500 then waits for the rising edge of the slow clock (clock input signal 1528). When rising edge of the slow clock is detected, the PLL system 1500 selects the slow clock signal to be the reference input to the phase detector (S1716). Referring to FIG. 15, PLL system 1500 first waits for a couple of cycles of clock input signal 1528, and then via select signal 1532, selects clock input signal 1528 to be passed through as selected reference input signal 1546 that is input into phase detector 510. In this manner, reference divider 1508 is bypassed, as select reference input signal 1546 comes directly from clock input signal 1528, via multiplexors 1504 and 1510 and de-multiplexor 1506.

Next, the feedback divider ratio is changed so that the PLL output frequency remains constant (S1718). Referring to FIG. 15, the divide ratio N of feedback divider 508 is changed to an appropriate value, such that upon relock, divided feedback signal 538 output from feedback divider 508 will match selected reference input signal 1546 going into phase detector 510. Therefore, there will be no phase error and PLL system 1500 will be able to keep the frequency of output signal 504 constant. From here, the next step is to wait for the relock condition to occur (S1724).

In the event that the slow clock was not selected (S1714), then the fast input clock is selected (S1720). Referring to FIG. 15, the system first waits for a couple of cycles of clock input signal 1528, and then via select signal 1532, selects the output of reference divider 1508 (divided reference signal 1544) to be passed through as selected reference input signal 1546 that is input into phase detector 510.

At this point, both the reference divider ratio and feedback divider ratio are changed so that the PLL output frequency remains constant (S1722). Referring to FIG. 15, the divide ratio M of reference divider 1508 and the divide ratio N of feedback divider 508 are changed to appropriate values such that, upon relock, divided feedback signal 538 output from feedback divider 508 will match selected reference input signal 1546 (from divided reference signal 1544, output from reference divider 1508) going into phase detector 510.

Regardless of whether PLL system ends up in either step S1716 or S1720, the system will next determine whether it is available to relock with positive edge of slow clock (S1724). Referring to FIG. 15, the system will check for a rising edge in synchronous CLRZ signal 566. Once synchronous CLRZ signal 566 goes high, PLL system 1500 is available for relock. Otherwise, the PLL system remains until synchronous CLRZ signal 566 goes high.

Once relocked, outputs of the dividers are enabled so that there is a transition from low to high level into both inputs of the phase detector at the same time (S1726). Referring to FIG. 15, synchronous CLRZ signal 566 going high results in divided reference signal 1544 of reference divider 1508 and divided feedback signal 538 of feedback divider 508 transitioning from low to high. Since reference divider 1508 and feedback divider 508 are controlled by synchronous CLRZ signal 566, the outputs are concurrently enabled.

New divide ratios are then loaded into the dividers, and the dividers are enabled to count down with each input clock edge (S1728). Referring to FIG. 15, synchronous CLRZ signal 566 going high allows the new divide ratio M of reference divider 1508 and divide ratio N of feedback divider 508, which were changed in step S1716 or S1720, to be loaded into their respective dividers. With the new data loaded, the counters inside reference divider 1508 and feedback divider 508 are enabled to start counting down on each clock edge of their respective inputs, for example as discussed above with reference to FIG. 7.

The phase detector then compares the rising edges of its two inputs (S1730). Referring to FIG. 15, phase detector 510 receives selected reference input signal 1546 from multiplexer 1310, which selects the output from reference divider 1508, and receives divided feedback signal 538 from feedback divider 508, and measures the phase difference between the two signals.

Based on the measured phase difference, the control voltage of feedback divider is then adjusted to change the output positive edge of the feedback divider output to the phase detector (S1732). Referring to FIG. 15, if phase detector 510 detects a non-zero phase difference between selected reference input signal 1546 and divided feedback signal 538, the pulses on UP signal 1550 and DOWN signal 1552 work to change the voltage on Vtune 1572 so that the frequency of output signal 504 adjusts, such that divided feedback signal 538 becomes more in phase with selected reference input signal 1546.

The phase-detector then checks again to determine whether the rising edges of its inputs are aligned (S1734). Referring to FIG. 15, phase detector 510 re-measures the phase difference to evaluate if the rising edges of selected reference input signal 1546 and divided feedback signal 538 are aligned. If the edges are aligned (zero phase difference), the pulses on UP signal 1550 and DOWN signal 1552 are identical, which results in zero transfer of charge to storage capacitors 524 and 530, and Vtune 1572 (and therefore output signal 504) is unchanged. Here, PLL system 1500 is considered (re-)locked and thus process 1700 returns to step S1704. On the other hand, if selected reference input signal 1546 and divided feedback signal 538 are still not aligned going into phase detector 510, process 1700 will returns to step S1722 to perform further adjustments until PLL system 1500 becomes locked.

Figure 18:
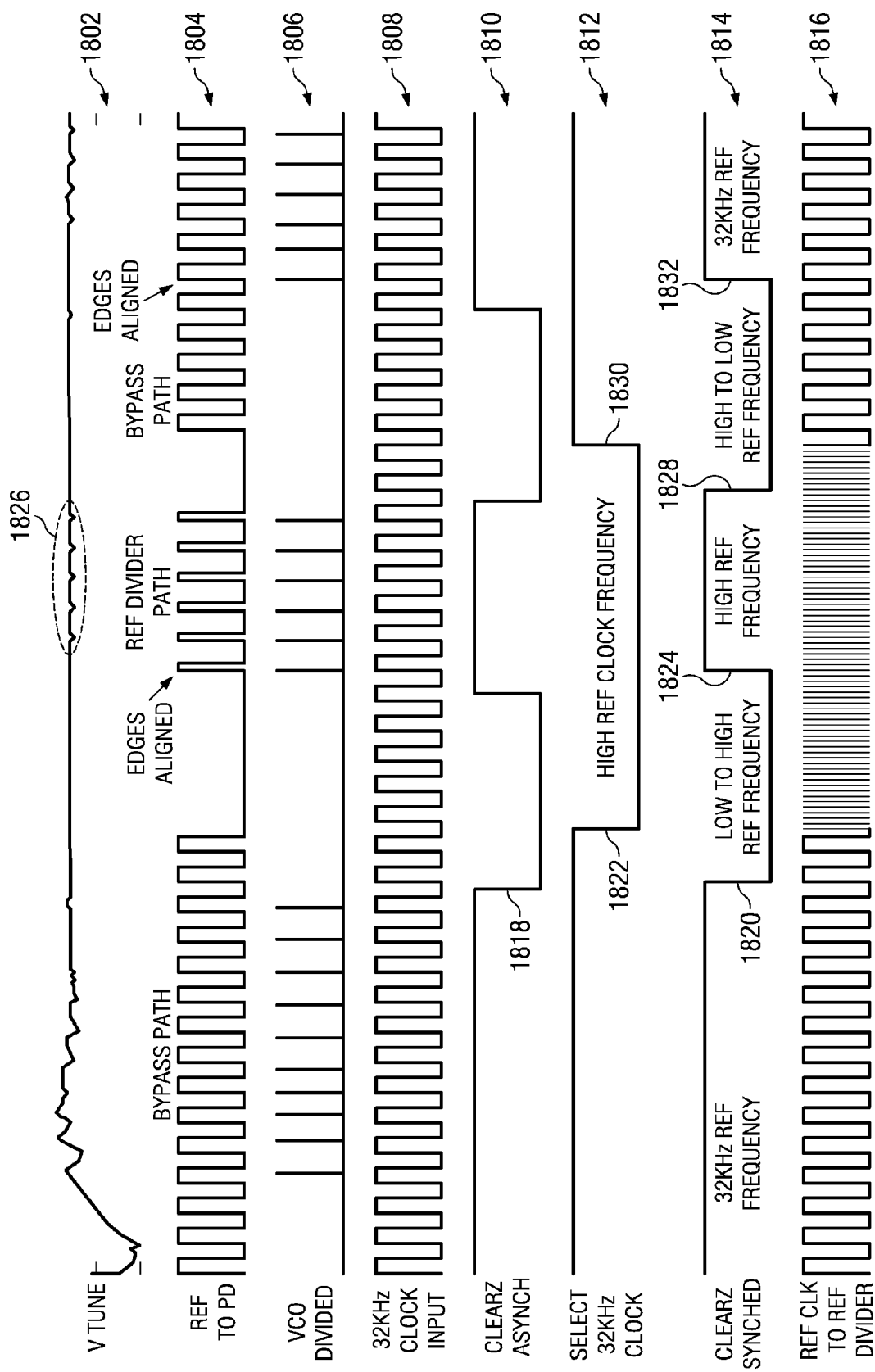
FIG. 18 illustrates a timing simulation of PLL system 1500 dynamically switching between slow and fast clocks, in accordance with the second present invention.

FIG. 18 illustrates a timing simulation of PLL system 1500 dynamically switching between slow and fast clocks, in accordance an aspect of the present invention. FIG. 18 includes eight waveforms illustrating voltages as a function of time: Vtune waveform 1802 shows the control voltage to VCO 560, Vtune 1572. Phase detector reference waveform 1804 shows selected reference input signal 1546 being input into phase detector 1508. Divided feedback waveform 1806 shows the output of the feedback divider 508, divided feedback signal 538. Waveform 1808 shows the slow clock (clock input signal 1528) that is used to synchronize the timing of the state machine 1514. Asynchronous CLRZ waveform 1810 shows asynchronous CLRZ signal 1530, which controls the holding and relocking of the loop. Select waveform 1812 shows the select signal 1532 in which a logic high selects the slow clock (clock input signal 1528). Synched waveform 1814 shows synchronized CLRZ signal 566, which controls reference divider 1508, feedback divider 508, and switches 518 and 516. Reference input waveform 1816 shows clock signal 1538 that is input to reference divider 1508 via de-multiplexor 1506.

The timing in the simulation begins with PLL system 1500 being locked to the 32 kHz clock from power-up (select waveform 1812 is initially high). Here, phase detector reference waveform 1804 is identical to waveform 1808, since it is currently bypassing reference divider 1508. Initially there are large changes to Vtune waveform 1802, until it eventually stabilizes when the phase and frequency divided feedback waveform 1806 tracks that of phase detector reference waveform 1804.

Then, at 400 μs, asynchronous CLRZ waveform 1810 goes low (time point 1818), signaling the beginning of the hold condition. At the next rising edge of waveform 1808, synchronous CLRZ waveform 1814 goes low (time point 1820), which causes switches 518 and 516 to open, and for divided feedback signal 538 and divided reference signal 1544 to go low. This can be seen in divided feedback waveform 1806, where after time point 1820 there is no longer any clock signal since the signal is low. Phase detector reference waveform 1804, since it is still bypassing reference divider 1508, continues to output a clock signal until 450 μs (time point 1822), in which select waveform 1812 goes low, thereby switching low to high reference frequency clock and allowing the output of reference divider 1508 (divided reference signal 1544) be passed through to the phase detector 510 as input. The change in reference frequency can be seen in reference input waveform 1816, where at time point 1822, the frequency switches from a slow 32 kHz frequency to a very high frequency.

Phase detector reference waveform 1804 and divided feedback waveform 1806 remain low until about 620 μs (time point 1824), when synchronous CLRZ waveform 1814 goes high and relocking begins. The rising edge of synchronous CLRZ waveform 1814 forces the outputs of reference divider 1508 and feedback divider 508 to be concurrently enabled, causing the rising edges of phase detector reference waveform 1804 and divided feedback waveform 1806 to align. This provides for ZPS, which minimizes the perturbance to Vtune waveform 1802. In the next clock cycle, the actual phase error due to charge leakage is measured and the small phase correction can be seen in the ripples in Vtune waveform 1802 (denoted by 1826).

Normal operation continues using the fast (high frequency) clock until 800 μs (time point 1828), when synchronous CLRZ waveform 1814 goes low again. Here, switches 518 and 516 are opened again and the outputs of reference divider 1508 and feedback divider 508 are disabled, which causes divided feedback signal 538 and divided reference signal 1544 go low. A few clock cycles later, (time point 1830), select waveform 1512 goes high which switches the reference frequency back to the slow clock (32 kHz frequency). At 1050 μs, synchronous CLRZ waveform 1814 goes high (time point 1832), indicating relock. As shown in phase detector waveform 1804 and divided feedback waveform 1806, the rising edges into phase detector 510 are aligned, thus causing minimal disturbance to Vtune waveform 1802 and ensuring that output signal 504 remains stable.

FIG. 18 illustrates the seamless operation of PLL system 1500 when dynamically switching between slow and fast reference clocks. The present invention minimizes output frequency changes during switching to less than 1%. This is a huge improvement as compared to about 20% frequency variation, which occurs in conventional architecture. A PLL system in accordance with the present invention therefore solves the problem of associated with conventional PLL systems—annoying audible glitches occurring when the PLL system switches between low power and normal operating power conditions.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit for use with a control signal and a clock signal having a plurality of clock pulses, each clock pulse having a rising edge and a falling edge, said circuit being operable to receive a reference signal and to output an output signal, said circuit comprising:
   an input divider portion arranged to receive the control signal and the reference signal and operable to output a divided reference signal;
   a feedback divider portion arranged to receive the control signal and the output signal and operable to output a divided feedback signal;
   a phase detector portion operable to receive the control signal and to output a phase detector signal based on the divided reference signal and the divided feedback signal;
   a loop compensation filter portion operable to output a tuning signal based on the phase detector signal; and
   a voltage controlled oscillator portion operable to output the output signal based on the tuning signal,
   a first switch operable to be in one of a first open position and a first closed position; and
   a second switch operable to be in one of a second open position and a second closed position,
   wherein said phase detector portion is further operable to change the phase detector signal based on said input divider portion receiving the control signal and said feedback divider portion receiving the control signal, and further based on the control signal and a rising edge of a clock pulse;
   wherein said loop compensation filter portion comprises a first filter portion, a second filter portion and an operational amplifier portion;
   wherein said operational amplifier portion comprises a first input and a second input,
   wherein said first filter portion is operable to pass a first portion of the phase detector signal to the first input,
   wherein said second filter portion is operable to pass a second portion of the phase detector signal to the second input, and
   wherein said operational amplifier portion is operable to output the tuning signal based on a difference between the first portion of the phase detector signal and the second portion of the phase detector signal;
   wherein said first filter portion comprises a first capacitor operable to store a first charge, and
   wherein said second filter portion comprises a second capacitor operable to store a second charge;
   wherein when said first switch is in the first open position, said first capacitor is operable to maintain the first charge,
   wherein when said second switch is in the second open position, said second capacitor is operable to maintain the second charge,
   wherein when said first switch is in the first closed position, a first direct current path to ground is provided to said first capacitor, and
   wherein when said second switch is in the second closed position, a second direct current path to ground is provided to said second capacitor.

2. The circuit of claim 1,
   wherein said input divider portion comprises a first programmable counter operable to divide the reference signal by an integer M, where M>0, and
   wherein said feedback divider portion comprises a second programmable counter operable to divide the output signal by an integer N, where N>0.

3. The circuit of claim 1,
   wherein said input divider portion is further arranged to receive a CLRZ signal based on a rising edge of a pulse within the clock signal and is further operable to be enabled to output the divided reference signal based on the CLRZ signal, and
   wherein said feedback divider portion is further arranged to receive the CLRZ signal based on the rising edge of the pulse within the clock signal and is further operable to be enabled to output the divided feedback signal based on the CLRZ signal.

4. A circuit for use with a clock signal having a plurality of clock pulses, each clock pulse having a rising edge and a falling edge, said circuit being operable to receive a reference signal and to output an output signal, said circuit comprising:
   an input divider portion arranged to receive the reference signal and operable to output a divided reference signal;
   a feedback divider portion arranged to receive the output signal and operable to output a divided feedback signal;
   a loop compensation filter portion having a first filter portion, a second filter portion and an operational amplifier portion;
   a first switch operable to be in one of a first open position and a first closed position; and
   a second switch operable to be in one of a second open position and a second closed position,
   a phase detector portion operable to output a phase detector signal based on the divided reference signal and the divided feedback signal; and
   a voltage controlled oscillator portion operable to output the output signal based on the phase detector signal,
   wherein said input divider portion is further arranged to receive a CLRZ signal based on a rising edge of a pulse within the clock signal and is further operable to be enabled to output the divided reference signal based on the CLRZ signal, and
   wherein said feedback divider portion is further arranged to receive the CLRZ signal based on the rising edge of the pulse within the clock signal and is further operable to be enabled to output the divided feedback signal based on the CLRZ signal;
   wherein said operational amplifier portion comprises a first input and a second input,
   wherein said first filter portion is operable to pass a first portion of the phase detector signal to the first input,
   wherein said second filter portion is operable to pass a second portion of the phase detector signal to the second input, and
   wherein said operational amplifier portion is operable to output a tuning signal based on a difference between the first portion of the phase detector signal and the second portion of the phase detector signal;
   wherein said first filter portion comprises a first capacitor operable to store a first charge, and
   wherein said second filter portion comprises a second capacitor operable to store a second charge;
   wherein when said first switch is in the first open position, said first capacitor is operable to maintain the first charge, wherein when said second switch is in the second open position, said second capacitor is operable to maintain the second charge, wherein when said first switch is in the first closed position, a first direct current path to ground is provided to said first capacitor, and wherein when said second switch is in the second closed position, a second direct current path to ground is provided to said second capacitor.

5. The circuit of claim 4, wherein said input divider portion comprises a first programmable counter operable to divide the reference signal by an integer M, where M>0, and wherein said feedback divider portion comprises a second programmable counter operable to divide the output signal by an integer N, where N>0.

* * * * *